United States Patent
Karnstedt

(10) Patent No.: US 9,929,721 B2
(45) Date of Patent: Mar. 27, 2018

(54) PHASE AND AMPLITUDE DETECTION IN WIRELESS ENERGY TRANSFER SYSTEMS

(71) Applicant: WiTricity Corporation, Watertown, MA (US)

(72) Inventor: Curt Karnstedt, Austin, TX (US)

(73) Assignee: WiTricity Corporation, Watertown, MA (US)

(*) Notice: Subject to any disclaimer, the term of this patent is extended or adjusted under 35 U.S.C. 154(b) by 0 days.

(21) Appl. No.: 15/291,187

(22) Filed: Oct. 12, 2016

(65) Prior Publication Data

US 2017/0111029 A1    Apr. 20, 2017

Related U.S. Application Data

(60) Provisional application No. 62/241,194, filed on Oct. 14, 2015.

(51) Int. Cl.
*H03H 17/02* (2006.01)
*H02J 50/12* (2016.01)
(Continued)

(52) U.S. Cl.
CPC ............ *H03H 17/02* (2013.01); *G01R 25/00* (2013.01); *G01R 25/04* (2013.01); *H02J 7/025* (2013.01);
(Continued)

(58) Field of Classification Search
CPC ..... G01R 25/04; H03H 17/0045; H03H 17/02
See application file for complete search history.

(56) References Cited

U.S. PATENT DOCUMENTS 645,576 A    3/1900    Tesla
649,621 A    5/1900    Tesla
(Continued)

FOREIGN PATENT DOCUMENTS

CA    142352    8/1912
CN    102239633    11/2011
(Continued)

OTHER PUBLICATIONS

International Search Report and Written Opinion of the International Searching Authority for International Application No. PCT/US2016/056643 dated Apr. 10, 2017 (20 pages).
(Continued)

*Primary Examiner* — Jeffrey Zweizig
(74) *Attorney, Agent, or Firm* — Fish & Richardson P.C.

(57) ABSTRACT

Methods, systems, and apparatus, including computer programs encoded on a computer storage medium, for detecting characteristics of an input signal. One aspect includes a first finite impulse response (FIR) filter, a second FIR filter, and a controller coupled with the first and second FIR filters. The first FIR filter receives an input signal and a first reference signal. The first FIR filter filters the first reference signal to generate a first sinusoidal signal and mixes the first sinusoidal signal and the input signal to generate a first mixed signal. The second FIR filter receives the input signal and a second reference signal. The second FIR filter filters the second reference signal to generate a second sinusoidal signal and mixes the second sinusoidal signal and the input signal to generate a second mixed signal. The controller determines characteristics of the input signal based on the first and second mixed signals.

24 Claims, 10 Drawing Sheets

(51) Int. Cl.
*H02J 7/02* (2016.01)
*H03H 17/00* (2006.01)
*G01R 25/00* (2006.01)
*G01R 25/04* (2006.01)

(52) U.S. Cl.
CPC ......... *H02J 50/12* (2016.02); *H03H 17/0045* (2013.01)

(56) References Cited

U.S. PATENT DOCUMENTS

| | | | |
|---|---|---|---|
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 3,961,172 A | 6/1976 | Hutcheon |
| 4,088,999 A | 5/1978 | Fletcher et al. |
| 4,095,998 A | 6/1978 | Hanson |
| 4,180,795 A | 12/1979 | Matsuda et al. |
| 4,274,736 A | 6/1981 | Balmer |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hiering et al. |
| 5,053,774 A | 10/1991 | Schuermann et al. |
| 5,070,293 A | 12/1991 | Ishii et al. |
| 5,118,997 A | 6/1992 | El-Hamamsy |
| 5,216,402 A | 6/1993 | Carosa |
| 5,229,652 A | 7/1993 | Hough |
| 5,287,112 A | 2/1994 | Schuermann |
| 5,341,083 A | 8/1994 | Klontz et al. |
| 5,367,242 A | 11/1994 | Hulman |
| 5,374,930 A | 12/1994 | Schuermann |
| 5,408,209 A | 4/1995 | Tanzer et al. |
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,541,604 A | 7/1996 | Meier |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,703,461 A | 12/1997 | Minoshima et al. |
| 5,703,573 A | 12/1997 | Fujimoto et al. |
| 5,710,413 A | 1/1998 | King et al. |
| 5,742,471 A | 4/1998 | Barbee, Jr. et al. |
| 5,821,728 A | 10/1998 | Sshwind |
| 5,821,731 A | 10/1998 | Kuki et al. |
| 5,864,323 A | 1/1999 | Berthon |
| 5,898,579 A | 4/1999 | Boys et al. |
| 5,903,134 A | 5/1999 | Takeuchi |
| 5,923,544 A | 7/1999 | Urano |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 | 11/2005 | Landis |
| 6,975,198 B2 | 12/2005 | Baarman |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Govorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,266,361 B2 * | 9/2007 | Burdett ............ H04B 1/26 455/323 |
| 7,288,918 B2 | 10/2007 | DiStefano |
| 7,340,304 B2 | 3/2008 | MacDonald |
| 7,346,136 B1 | 3/2008 | Aiello |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |

(56) References Cited

U.S. PATENT DOCUMENTS

| | | |
|---|---|---|
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,880,337 B2 | 2/2011 | Farkas |
| 7,884,697 B2 | 2/2011 | Wei et al. |
| 7,885,050 B2 | 2/2011 | Lee |
| 7,919,886 B2 | 4/2011 | Tanaka |
| 7,923,870 B2 | 4/2011 | Jin |
| 7,932,798 B2 | 4/2011 | Tolle et al. |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,001,172 B2 * | 8/2011 | Mallinson .............. H03H 15/00 708/5 |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 9,647,640 B2 * | 5/2017 | Mallinson .............. H03H 15/02 |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |

(56) References Cited

U.S. PATENT DOCUMENTS

| | | |
|---|---|---|
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |

(56) References Cited

U.S. PATENT DOCUMENTS

| | | |
|---|---|---|
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0207820 A1 | 8/2010 | Kawano et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0171920 A1 | 7/2011 | Kim et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |

(56) References Cited

U.S. PATENT DOCUMENTS

| | | |
|---|---|---|
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0195157 A1 | 8/2013 | Xu |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0062551 A1 | 3/2014 | Bhaumik et al. |
| 2014/0070764 A1 | 3/2014 | Keeling |

FOREIGN PATENT DOCUMENTS

| | | | |
|---|---|---|---|
| CN | 102439669 | 5/2012 | |
| CN | 103329397 | 9/2013 | |
| CN | 103855928 | 6/2014 | ............ H02M 1/08 |
| DE | 38 24 972 | 1/1989 | |
| DE | 100 29147 | 12/2001 | |
| DE | 200 16 655 | 3/2002 | |
| DE | 102 21 484 | 11/2003 | |
| DE | 103 04 584 | 8/2004 | |
| DE | 10 2005 036290 | 2/2007 | |
| DE | 10 2006 044057 | 4/2008 | |
| EP | 1 335 477 | 8/2003 | |
| EP | 1 521 206 | 4/2005 | |
| EP | 1 524 010 | 4/2005 | |
| EP | 2 357 716 | 8/2011 | |
| JP | 02-097005 | 4/1990 | |
| JP | 4-265875 | 9/1992 | |
| JP | 6-341410 | 12/1994 | |
| JP | 9-182323 | 7/1997 | |
| JP | 9-298847 | 11/1997 | |
| JP | 10-164837 | 6/1998 | |
| JP | 11-75329 | 3/1999 | |
| JP | 11-188113 | 7/1999 | |
| JP | 2001-309580 | 11/2001 | |
| JP | 2002-010535 | 1/2002 | |
| JP | 2003-179526 | 6/2003 | |
| JP | 2004-166459 | 6/2004 | |
| JP | 2004-201458 | 7/2004 | |
| JP | 2004-229144 | 8/2004 | |
| JP | 2005-57444 | 3/2005 | |
| JP | 2005-149238 | 6/2005 | |
| JP | 2006-074848 | 3/2006 | |
| JP | 2007-505480 | 3/2007 | |
| JP | 2007-266892 | 10/2007 | |
| JP | 2007-537637 | 12/2007 | |
| JP | 2008-508842 | 3/2008 | |
| JP | 2008-206231 | 9/2008 | |
| JP | 2008-206327 | 9/2008 | |
| JP | 2011-072074 | 4/2011 | |
| JP | 2012-504387 | 2/2012 | |
| JP | 2013-543718 | 12/2013 | |
| KR | 10-2007-0017804 | 2/2007 | |
| KR | 10-2008-0007635 | 1/2008 | |
| KR | 10-2009-0122072 | 11/2009 | |
| KR | 10-2011-0050920 | 5/2011 | |
| SG | 112842 | 7/2005 | |
| WO | WO 92/17929 | 10/1992 | |
| WO | WO 93/23908 | 11/1993 | |
| WO | WO 94/28560 | 12/1994 | |
| WO | WO 95/11545 | 4/1995 | |
| WO | WO 96/02970 | 2/1996 | |
| WO | WO 98/50993 | 11/1998 | |
| WO | WO 00/77910 | 12/2000 | |
| WO | WO 03/092329 | 11/2003 | |
| WO | WO 03/096361 | 11/2003 | |
| WO | WO 03/096512 | 11/2003 | |
| WO | WO 2004/015885 | 2/2004 | |
| WO | WO 2004/038888 | 5/2004 | |

(56) References Cited

FOREIGN PATENT DOCUMENTS

| | | |
|---|---|---|
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2011/061388 | 5/2011 |
| WO | WO 2011/061821 | 5/2011 |
| WO | WO 2011/062827 | 5/2011 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |

OTHER PUBLICATIONS

Invitation to Pay Additional Fees and Communication Relating to the Results of the Partial International Search for International Application No. PCT/US2016/056643 dated Feb. 16, 2017.
"Intel CTO Says Gap between Humans, Machines Will Close by 2050", *Intel News Release*, (See intel.com/.../20080821comp.htm?iid=S . . . ) (Printed Nov. 6, 2009).
"Physics Update, Unwired Energy", *Physics Today*, pp. 26, (Jan. 2007) (See http://arxiv.org/abs/physics/0611063.).
"In pictures: A year in technology", *BBC News*, (Dec. 28, 2007).
"Next Little Thing 2010 Electricity without wires", CNN Money (See money.cnn.com/galleries/2009/smallbusiness/0911/gallery.next_little_thing_2010.smb/) (dated Nov. 30, 2009).
Abe et al. "A Noncontact Charger Using a Resonant Converter with Parallel Capacitor of the Secondary Coil". IEEE, 36(2):444-451, Mar./Apr. 2000.
Ahmadian, M. et al., "Miniature Transmitter for Implantable Micro Systems", *Proceedings of the 25th Annual International Conference of the IEEE EMBS Cancun, Mexico*, pp. 3028-3031 (Sep. 17-21, 2003).

Aoki, T. et al., "Observation of strong coupling between one atom and a monolithic microresonator", Nature, vol. 443:671-674 (2006).
Apneseth et al. "Introducing wireless proximity switches" ABB Review Apr. 2002.
Aristeidis Karalis et al., "Efficient Wireless non-radiative mid-range energy transfer", *Annals of Physics*, vol. 323, pp. 34-48 (2008).
Baker et al., "Feedback Analysis and Design of RF Power Links for Low-Power Bionic Systems," *IEEE Transactions on Biomedical Circuits and Systems*, vol. 1(1):28-38 (Mar. 2007).
Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/1114/2, (Nov. 14, 2006) 2 pages.
Biever, C., "Evanescent coupling could power gadgets wirelessly", NewScientistsTech.com, http://www. newscientisttech.com/article.ns?id=dn1 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).
Boyle, A., "Electro-nirvana? Not so fast", MSNBC, http://lcosmiclog.msnbc.msn.com/_news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging the Wireless Way—Even physicists forget to recharge their cell phones sometimes.", PC Magazine, ABC News Internet Ventures, (Dec. 12, 2006) 1 page.
Chinaview, ,"Scientists light bulb with 'wireless electricity'",www.Chinaview.cn, http://news.xinhuanet.com/english/2007-06/08/content_6215681.htm,Jun. 2007,1 page.
Cooks, G., "The vision of an MIT physicist: Getting rid of pesky rechargers", Boston.com, (Dec. 11, 2006) 1 page.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).
Esser et al., "A New Approach to Power Supplies for Robots", IEEE, vol. 27(5):872-875, (Sep./Oct. 1991).
Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).
Fenske et al., "Dielectric Materials at Microwave Frequencies", Applied Microwave & Wireless, pp. 92-100 (2000).

(56) References Cited

OTHER PUBLICATIONS

Fernandez, C. et al., "A simple dc-dc converter for the power supply of a cochlear implant", *IEEE*, pp. 1965-1970 (2003).
Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).
Fildes, J., "Physics Promises Wireless Power", (Science and Technology Reporter), BBC News, (Nov. 15, 2006) 3 pages.
Fildes, J., "The technology with impact 2007", BBC News, (Dec. 27, 2007) 3 pages.
Fildes, J., "Wireless energy promise powers up", BBC News, http://news.bbc.co.uk/2/hi/technology/6725955.stm, (Jun. 7, 2007) 3 pages.
Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).
Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D.H., "Power on a Chip", MIT Technology Review, (Nov. 2004).
Gary Peterson, "MIT WiTricity Not so Original After All", *Feed Line No. 9*, (See http://www.tfcbooks.com/articles/witricity.htm) printed Nov. 12, 2009.
Geyi, Wen, "A Method for the Evaluation of Small Antenna Q", IEEE Transactions on Antennas and Propagation, vol. 51(8):2124-2129 (Aug. 2003).
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).
Highfield, R., "Wireless revolution could spell end of plugs",(Science Editor), Telegraph.co.uk, http://www.telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).
Hirai et al., "Practical Study on Wireless Transmission of Power and Information for Autonomous Decentralized Manufacturing System", IEEE, vol. 46(2):349-359, Apr. 1999.
Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
INFOTECH Online, "Recharging gadgets without cables", infotech.indiatimes.com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).
Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resonances", *Science* vol. 317, pp. 83-86 (Jul. 6, 2007).
Kurs, A. et al., "Simultaneous mid-range power transfer to multiple devices", *Applied Physics Letters*, vol. 96, No. 044102 (2010).
Kurs, A. et al.,"Optimized design of a low-resistance electrical conductor for the multimegahertz range", *Applied Physics Letters*, vol. 98:172504-172504-3 (Apr. 2011).
Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages (2003).
Lee, "RFID Coil Design," Microchip Technology Inc., AN678, 21 pages (1998).
Liang et al., "Silicon waveguide two-photon absorption detector at 1.5 μm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Mediano, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R. ,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, ,"The world's first sheet-type wireless power transmission system: Will a socket be replaced by e-wall?",Public Relations Office, School of Engineering, University of Tokyo, Japan,Dec. 12, 2006,4 pages.
PRESSTV, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/ business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).

(56) References Cited

OTHER PUBLICATIONS

Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M., "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.
Zierhofer, Clemens M. et al., "High-Efficiency Coupling-Insensitive Transcutaneous Power and Data Transmission via an Inductive Link", *IEEE Transactions on Biomedical Engineering*, vol. 37, No. 7, pp. 716-722 (Jul. 1990).

\* cited by examiner

PHASE AND AMPLITUDE DETECTION IN WIRELESS ENERGY TRANSFER SYSTEMS

CROSS-REFERENCE TO RELATED APPLICATION

This application claims priority to U.S. Provisional Patent Application No. 62/241,194, filed on Oct. 14, 2015, the entire contents of which are incorporated herein by reference.

BACKGROUND

Electronic devices may need to detect the phase of current or voltage signals in circuits of the device or in circuits of other devices within a system. In some applications, an electronic device may need to determine the phase difference between two signals. Existing phase detection circuits, devices, or systems may introduce harmonic distortions, require complex circuitry, or need relatively long computation times.

SUMMARY

In general, the disclosure features phase and amplitude detection circuits and devices. In a first aspect, the disclosure features a phase detection device including an input terminal, a signal generator, a first mixer coupled with the signal generator and the input terminal, a second mixer coupled with the signal generator and the input terminal, and a controller coupled with the first mixer and the second mixer. The input terminal receives an input signal to the phase detection device. The signal generator generates a first reference signal and a second reference signal. The second reference signal is approximately 90 degrees out of phase with the first reference signal. The first mixer mixes the first reference signal and the input signal to generate a first mixed signal. The second mixer mixes the second reference signal and the input signal to generate a second mixed signal. The controller is configured to shift a phase of the first and the second reference signals until a value of the second mixed signal divided by the first mixed signal reaches a threshold value, and determine a phase of the input signal based on a phase shift value, the phase shift value representing an amount that the phase of the first and second reference signals are shifted.

This and other implementations can each optionally include one or more of the following features.

The controller can be configured to subtract the phase shift value from 90 degrees. The controller can be configured to subtract the phase shift value from the arctangent of the quotient of the second mixed signal divided by the first mixed signal. The controller can be configured to provide data indicating the phase of the input signal to an impedance matching network. The controller can be one of: a microcontroller, a computer processor, a field programmable logic array (FPGA), or an application specific integrated circuit (ASIC).

In some implementations, the phase detection device can include a first filter coupled between the first mixer and the controller and a second filter coupled between the second mixer and the controller. The first filter can filter the first mixed signal such that the first mixed signal is a direct current (DC) signal, and the a second filter can filter the second mixed signal such that the second mixed signal is a DC signal.

In some implementations, the phase detection device can include an impedance matching network coupled with the controller. The impedance matching network can be configured to receive data indicating the phase of the input signal from the controller and adjust an impedance value of a resonator in accordance with the received data.

In some implementations, the input terminal of the phase detection device is a first input terminal that receives a first input signal. The phase detection device can include a second input terminal that receives a second input signal and a multiplexer. The multiplexer can include a first input coupled with the first input terminal, a second input coupled with the second input terminal, and an output coupled with the first mixer and the second mixer. The controller can be configured to select the second input signal from the multiplexer, such that the first mixer mixes the first reference signal and the second input signal to generate a third mixed signal, and the second mixer mixes the second reference signal and the second input signal to generate a fourth mixed signal; shift a phase of the first reference signal and a phase of the second reference signal until a value of the fourth mixed signal divided by the third mixed signal reaches the threshold value; determine a phase of the second input signal based on a second phase shift value, the second phase shift value representing an amount that the phase of the first reference signal and the phase of the second reference signal are shifted; and determine a phase difference between the first input signal and the second input signal.

In some implementations, the input terminal of the phase detection device is a first input terminal that receives a first input signal. The phase detection device can include a second input terminal that receives a second input signal, a third mixer coupled with the signal generator and the second input terminal, and a fourth mixer coupled with the signal generator and the second input terminal. The third mixer mixes the first reference signal and the second input signal and to thereby generate a third mixed signal. The fourth mixer mixes the second reference signal and the second input signal and to thereby generate a fourth mixed signal. The controller is configured to shift a phase of the first reference signal and a phase of the second reference signal until a value of the fourth mixed signal divided by the third mixed signal reaches the threshold value, determine a phase of the second input signal based on a second phase shift value, the second phase shift value representing an amount that the phase of the first reference signal and the phase of the second reference signal are shifted, and determine a phase difference between the input signal and the second input signal.

In a second aspect, the disclosure features a phase detection device including a first input terminal, second input terminal, a signal generator, a first mixer coupled with the signal generator and the first input terminal, a second mixer coupled with the signal generator and the second input terminal, and a controller coupled with the first mixer, the second mixer, and the signal generator. The first input terminal receives a first input signal to the phase detection device, and the second input terminal receives a second input signal to the phase detection device. The signal generator generates a sinusoidal reference signal. The first mixer mixes the reference signal and the first input signal to generate a first mixed signal. The second mixer mixes the reference signal and the second input signal to generate a second mixed signal. The controller is configured to shift a phase of the reference signal; detect a zero crossing of the first mixed signal and, in response to detecting the zero crossing of the first mixed signal, store first data representing the phase of the reference signal; detect a zero crossing of the second mixed signal and, in response to detecting the zero crossing of the second mixed signal, store second data representing the phase of the reference signal; and determine a phase difference between the first input signal and the second input signal by based on a difference between the first data and the second data.

This and other implementations can each optionally include one or more of the following features.

In some implementations, the phase detection device can include a first filter coupled between the first mixer and the controller and a second filter coupled between the second mixer and the controller. The first filter can filter the first mixed signal such that the first mixed signal is a direct current (DC) signal, and the a second filter can filter the second mixed signal such that the second mixed signal is a DC signal.

In some implementations, the phase detection device includes a first comparator coupled with first mixer and the controller, and a second comparator coupled with the second mixer and the controller. And, detecting the zero crossing of the first mixed signal includes detecting an edge of an output signal of the first comparator, and detecting the zero crossing of the second mixed signal includes detecting an edge of an output signal of the second comparator.

The reference signal can be phase-adjustable in a fixed number of steps. The first data and the second data can represent first and second steps of the sinusoidal reference signal. Determining the phase difference between the first input signal and the second input signal can include multiplying the difference between the first data and the second data by a step size associated with steps of the sinusoidal reference signal.

The controller can be configured to provide data indicating the phase difference between the first input signal and the second input signal to an impedance matching network. The controller can be one of: a microcontroller, a computer processor, a field programmable logic array (FPGA), or an application specific integrated circuit (ASIC).

In some implementations, the phase detection device can include an impedance matching network coupled with the controller. The impedance matching network can be configured to receive data indicating the phase difference between the first input signal and the second input signal from the controller and adjust an impedance value of a resonator in accordance with the received data.

In a third aspect, the disclosure features an electronic device including a first finite impulse response (FIR) filter, a second FIR filter, and a controller coupled with the first FIR filter and the second FIR filter. The first FIR filter receives an input signal and a first reference signal. The first FIR filter filters the first reference signal to generate a first sinusoidal signal and mixes the first sinusoidal signal and the input signal to generate a first mixed signal. The second FIR filter receives the input signal and a second reference signal, wherein the second FIR filter filters the second reference signal to generate a second sinusoidal signal and mixes the second sinusoidal signal and the input signal to generate a second mixed signal. The controller is configured to determine a characteristic of the input signal based on the first mixed signal and the second mixed signal.

This and other implementations can each optionally include one or more of the following features.

In some implementations, the characteristic of the input signal can be a phase or an amplitude of the input signal. The characteristic of the input signal can include both a phase and an amplitude of the input signal. The first and second reference signals can be square waves. The square waves can be time-sampled square waves. A sampling rate of the square waves can be twelve times a fundamental frequency of the square waves. The first reference signal can be phase shifted with respect to the second reference signal by a predetermined number of samples.

In some implementations, each of the first and the second FIR filter can include a plurality of filter zeros, and the filter zeros can be selected to cancel harmonic frequencies of the first or second reference signal. The zeros of each of the first and the second FIR filter can be selected to cancel third, fifth, seventh, and ninth harmonics of the first or second reference signal.

In some implementations, each of the first and the second FIR filter include a plurality of filter taps. Each filter tap can include a delay circuit, a switch, and a resistor electrically connected to a terminal of the switch, where one of the first or the second reference signal is applied to an input of the delay circuit, the switch is controlled by an output of the delay circuit, and the input signal passes through the switch. Values for the resistors of the plurality of filter taps for each of the first and second FIR filters can represent filter zeros that are selected to cancel harmonic frequencies of the first or second reference signal. Each of the first and the second FIR filters can include five filter taps.

In some implementations, the electronic device includes a first filter coupled with the first FIR filter and the controller and a second filter coupled with the second FIR filter and the controller. The first filter can filter the first mixed signal such that the first mixed signal is a direct current (DC) signal, and the second filter can filter the second mixed signal such that the second mixed signal is a DC signal.

In some implementations, determining the phase of the input signal by the controller can include determining an arctangent of a quotient of the second mixed signal divided by the first mixed signal. The controller can be configured to provide data indicating the phase of the input signal to an impedance matching network. The controller can be one of: a microcontroller, a computer processor, a field programmable logic array (FPGA), or an application specific integrated circuit (ASIC).

In some implementations, the phase detection device can include an impedance matching network coupled with the controller. The impedance matching network can be configured to receive data indicating the phase of the input signal from the controller and adjust an impedance value of a resonator in accordance with the received data.

In some implementations, the electronic device includes a third FIR filter and a fourth FIR filter. The third FIR filter receives a second input signal and the first reference signal. The third FIR filter filters the first reference signal to generate a first sinusoidal signal and mixes the first sinusoidal signal and the second input signal to generate a third mixed signal. The fourth FIR filter receives the second input signal and the second reference signal. The fourth FIR filter filters the second reference signal to generate a second sinusoidal signal and mixes the second sinusoidal signal and the second input signal to generate a fourth mixed signal. The controller is coupled with the third FIR filter and the fourth FIR filter and configured to determine a phase of the second input signal based on the third mixed signal and the fourth mixed signal, and determine a phase difference between the input signal and the second input signal.

In a fourth aspect, the disclosure features a finite impulse response (FIR) filter including a plurality of filter taps, an operational amplifier, and a feedback path. Each filter tap includes a delay circuit, a switch, and a resistor. The delay circuit includes an input terminal to receive a square wave and an output terminal to output a delayed version of the square wave. The switch includes an input terminal, an output terminal, and a control terminal. The control terminal of the switch is electrically connected to the output terminal of the delay circuit to receive the delayed version of the square wave at the control terminal, and the input terminal of the switch is electrically connected to a common input signal line for the plurality of filter taps. The resistor is electrically connected to one of the input terminal or the output terminal of the switch. An output terminal of each of the plurality of filter taps is electrically connected to an input terminal of the operational amplifier. The feedback path electrically connects an output terminal of the operational amplifier to the input terminal of the operational amplifier.

This and other implementations can each optionally include one or more of the following features.

In some implementations, values for the resistors of the plurality of filter taps represent filter zeros that are selected to cancel harmonic frequencies of the square wave. The filter zeros can be selected to cancel the third, fifth, seventh, ninth harmonics of the square wave. An output signal of the operation amplifier can be a mixed signal comprising an input signal mixed with a sinusoidal signal at a fundamental frequency of the square wave.

In some implementations, an input signal can be a direct current (DC) signal and the output signal of the operational amplifier is the sinusoidal signal at a fundamental frequency of the square wave. Each delay circuit of the plurality of filter taps can include a flip-flop.

Particular implementations of the subject matter described in this specification can be implemented so as to realize one or more of the following advantages. Implementations may accurately detect phase, amplitude, or both of input signals that have relatively high harmonic content. Some implementations may correct for phase errors between two reference signals used to detect a phase of an input signal. Some implementations may generate sinusoidal reference signals having minimal harmonic content (e.g., "clean" reference signals). Some implementations may generate a pair of reference signals having minimal phase error between the signals by using phase shifted digital signals. Some implementations may accommodate a input signals having a large amplitude range.

Embodiments of the phase detection devices can also include any of the other features disclosed herein, including features disclosed in combination with different embodiments, in any combination as appropriate.

The details of one or more implementations of the subject matter described in this specification are set forth in the accompanying drawings and the description below. Other features, aspects, and advantages of the subject matter will be apparent from the description, the drawings, and the claims.

BRIEF DESCRIPTION OF THE DRAWINGS

Like reference numbers and designations in the various drawings indicate like elements.

DETAILED DESCRIPTION

Figure 1:
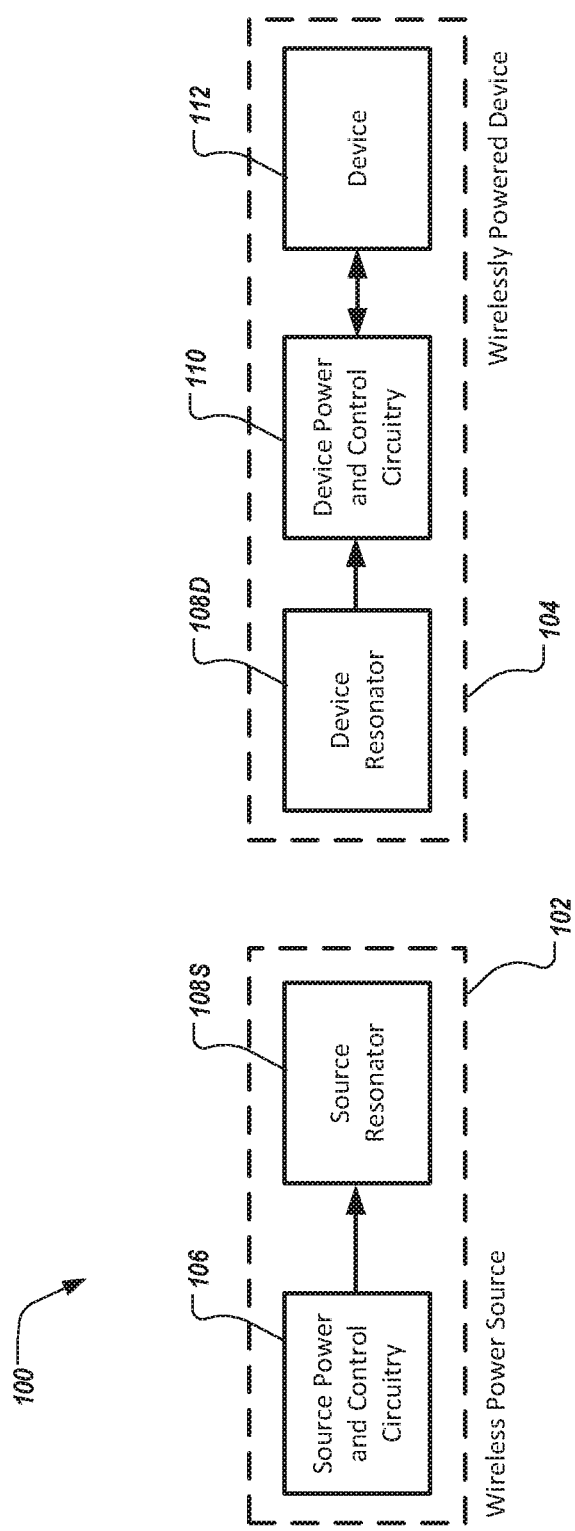
FIG. 1 shows a block diagram of an example of a wireless power transfer system.

Wireless energy transfer systems described herein can be implemented using a wide variety of resonators and resonant objects. As those skilled in the art will recognize, important considerations for resonator-based power transfer include resonator quality factor and resonator coupling. Extensive discussion of such issues, e.g., coupled mode theory (CMT), coupling coefficients and factors, quality factors (also referred to as Q-factors), and impedance matching is provided, for example, in U.S. patent application Ser. No. 13/428,142, published on Jul. 19, 2012 as US 2012/0184338, in U.S. patent application Ser. No. 13/567,893, published on Feb. 7, 2013 as US 2013/0033118, and in U.S. patent application Ser. No. 14/059,094, published on Apr. 24, 2014 as US 2014/0111019. The entire contents of each of these applications are incorporated by reference herein.

Power transfer systems may rely on electronic circuits such as rectifiers, AC (Alternating Current) to DC (Direct Current) converters, impedance matching circuits, and other power electronics to condition, monitor, maintain, and/or modify the characteristics of the voltage and/or current used to provide power to electronic devices. Power electronics can provide power to a load with dynamic input impedance characteristics. In some cases, in order to enable efficient power transfer, a dynamic impedance matching network is provided to match varying load impendences to that of the power source.

In some applications such as wireless power transfer, load impedances for a wireless power supply device may vary dynamically. In such applications, impedance matching between a load, such as a resonator coil, and a power supply of the device may be required to prevent unnecessary energy losses and excess heat. For example, the impedance associated with a resonator coil may be dynamic, in which case, a dynamic impedance matching network can be provided to match the varying power supply impedance (e.g., a device resonator) to that of the device. In the case of a wirelessly powered device, power supply impedances (e.g., a device resonator coil) may be highly variable. Therefore, an impedance matching network can be supplied between the device resonator coil and the power source of the device (e.g., battery or battery charging circuitry) to promote efficient transfer of power. Accordingly, power transfer systems transferring and/or receiving power via highly resonant wireless energy transfer, for example, may be required to configure or modify impedance matching networks to maintain efficient power transfer. The power electronics used in existing devices may not be capable of accurately detecting or measuring impedance mismatches or of rapidly accounting for impedance variations.

In the devices disclosed herein, power transfer and receive circuits can include phase and/or amplitude detection circuits or devices. Phase detection circuits can measure the phase of voltage or current signals within a power source or device to determine a mismatch between a power supply impedance and a load impedance, and to configure elements of an impedance matching network to minimize or eliminate the impedance mismatch. For example, a phase detection circuit can detect the phase of a power supply current and that of a load current. A difference in phase between the phase of a power supply current and that of a load current indicates an impedance mismatch between the power supply and the load. The phase difference can be used by an electronic device to configure an impedance matching network to minimize the impedance mismatch and, thereby, maximize power transfer efficiency.

While the phase detection circuits, methods, and systems disclosed herein are discussed in the context of a wireless power transfer system, it should be appreciated that they may be useful with other electronic devices as well. For example, phase detection circuits, devices, methods, and systems disclosed herein can be used in power factor correction devices, portable network analyzers, communication systems, and other electronic devices.

FIG. 1 shows a block diagram of an example wireless power transfer system 100. The system 100 includes a wireless power source 102 and a wirelessly powered or wirelessly charged device 104. Wirelessly powered or wirelessly charged devices 104 can include, for example, electronic devices such as laptops, smartphones, tablets, and other mobile electronic devices that are commonly placed on desktops, tabletops, bar tops, and other types of surfaces. The device 104 includes a device resonator 108D, device power and control circuitry 110, and a wirelessly powered or wirelessly charged electronic device 112, to which either DC or AC or both AC and DC power is transferred. The wireless power source 102 includes source power and control circuitry 106 and a source resonator 108S. The electronic device 112 or devices that receive power from the device resonator 108D and device power and control circuitry 110 can be, for example, an electronic device such as a laptop, smartphone, and other mobile electronic devices. The device resonator 108D and device circuitry 110 delivers power to the device/devices 112 that can be used to recharge the battery of the device/devices, power the device/devices directly, or both when in the vicinity of the source resonator 108S.

The power source 102 can be powered from a number of DC or AC voltage, current or power sources including, for example, a USB (Universal Serial Bus) port of a computer. In addition, the source 102 can be powered from the electric grid, from a wall plug, from a battery, from a power supply, from an engine, from a solar cell, from a generator, or from another source resonator. The source power and control circuitry 106 can include circuits and components to isolate the source electronics from the power supply, so that any reflected power or signals are not coupled out through the source input terminals.

The source power and control circuitry 106 can drive the source resonator 108S with alternating current, such as with a frequency greater than 10 kHz and less than 100 MHz (e.g., 6.78 MHz). The source power and control circuitry 106 can include, for example, impedance matching circuitry, a DC-to-DC converter, an AC-to-DC converter, or both an AC-to-DC converter and a DC-to-DC converter, an oscillator, and a power amplifier.

The device power and control circuitry 110 can be designed to transform alternating current power from the device resonator 108D to stable direct current power suitable for powering or charging one or more devices 112. The device power and control circuitry 110 can be designed to transform an alternating current power at one frequency (e.g., 6.78 MHz) from the device resonator to alternating current power at a different frequency suitable for powering or charging one or more devices 112. The power and control circuitry can include, for example, impedance matching circuitry, rectification circuitry, voltage limiting circuitry, current limiting circuitry, AC-to-DC converter circuitry, DC-to-DC converter circuitry, DC-to-AC converter circuitry, AC-to-AC converter circuitry, and battery charge control circuitry.

The power source 102 and the device 104 can have tuning capabilities, for example, dynamic impedance matching circuits, that allow adjustment of operating points to compensate for changing environmental conditions, perturbations, and loading conditions that can affect the operation of the source and device resonators and the efficiency of the energy transfer. The tuning capability can also be used to multiplex power delivery to multiple devices, from multiple sources, to multiple systems, to multiple repeaters or relays, and the like. The tuning capability can be controlled automatically, and may be performed continuously, periodically, intermittently or at scheduled times or intervals. In some implementations, manual input can be used to configure a control algorithm for tuning the impedance matching circuits.

The power source 102 and the device 104 resonators may be separated by many meters or they may be very close to each other or they may be separated by any distance in between. The source and device resonators 108S, 108D may be offset from each other laterally or axially. The source and device resonators 108S, 108D may be directly aligned (no lateral offset). The source and device resonators 108S, 108D may be oriented so that the surface areas enclosed by their inductive elements are approximately parallel to each other. The source and device resonators 108S, 108D may be oriented so that the surface areas enclosed by their inductive elements are approximately perpendicular to each other, or they may be oriented for any relative angle (0 to 360 degrees) between them. Such variations in the physical arrangement between the source and device resonators 108S, 108D may affect power coupling between the resonators 108S, 108D, and thereby, alter impedances exhibited by the resonators 108S, 108D to the source power and control circuitry 106 or device power and control circuitry 110, respectively.

Figure 2:
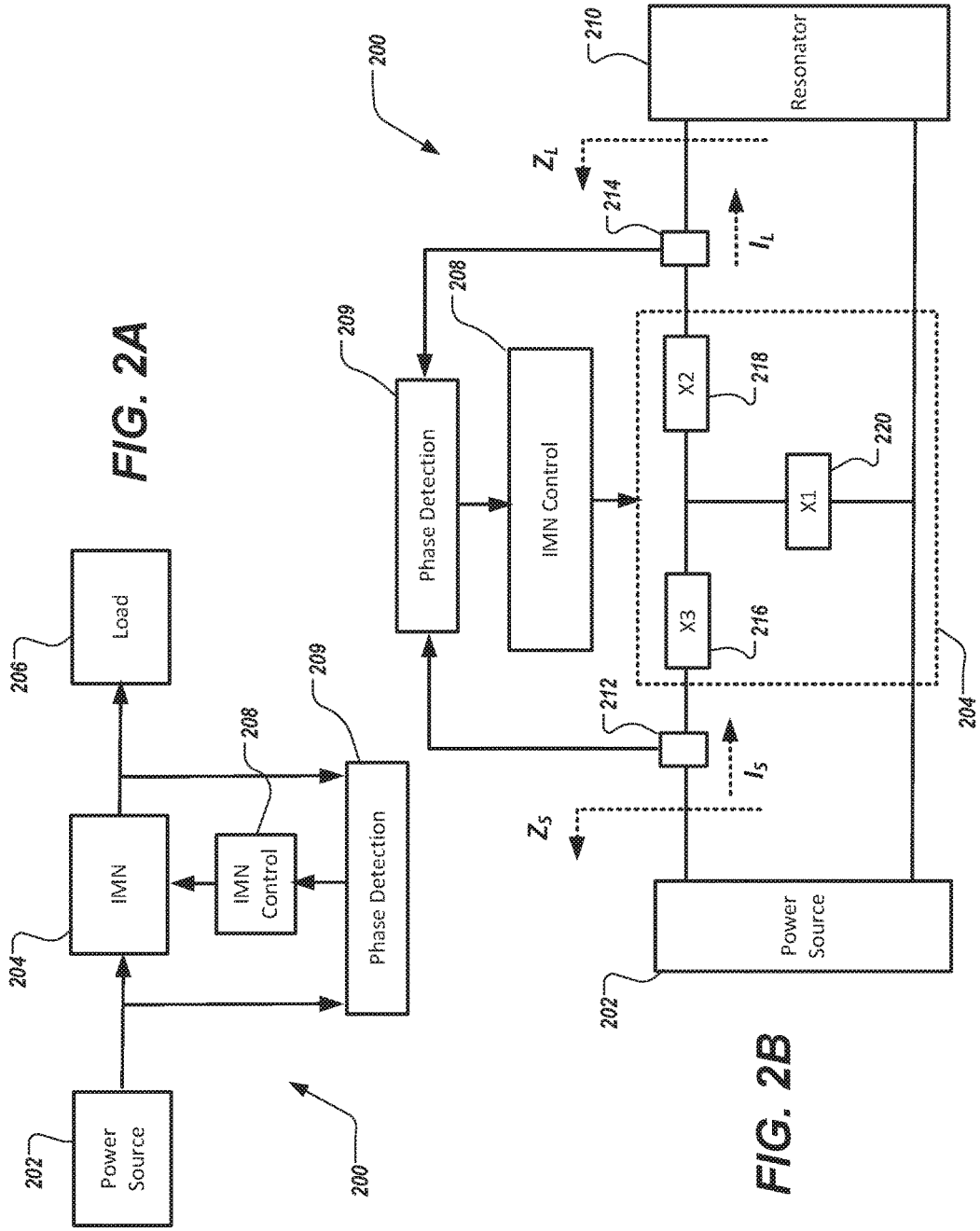
FIGS. 2A and 2B show block diagrams of an example wireless power transfer system including an impedance matching network.

FIGS. 2A and 2B show block diagrams of an example wireless power transfer system 200 including an impedance matching network (IMN) 204 and IMN control circuitry 208. The system 200 can, for example, be implemented as part of either the wireless power source 102 or the wirelessly powered or charged device 104 of FIG. 1. The system 200 includes a power source 202, an IMN 204, a load 206, and IMN control circuitry 208. The power source 202 can be the source power supply and control circuitry 106 of the wireless power source 102. The power source 202 can be the device resonator 108D of the device 104. The load 206 can be, for example, the source resonator 108S of the wireless power source 102. The load 206 can be the electronic device 112 powered by or a battery of the electronic device 112 charged by the device resonator 108D. The impedance exhibited by either the load 206 or the power source 202 may be dynamic and vary based on, for example, a physical position of a device 104 (e.g., a device resonator 108D) in relation to a wireless power source 102 (e.g., a source resonator 108S).

The impedance-matching network 204 can be designed to maximize the power delivered between power source 202 and the load 206 at a desired frequency (e.g., 6.78 MHz). The impedance matching components 216, 218, 220 in the IMN 204 can be chosen and connected so as to preserve a high-Q value of the resonator. Depending on the operating conditions, the components 216, 218, 220 in the IMN 204 can be automatically tuned to control the power delivered from the power source 202 to the load 206, for example, to maximize efficient transfer of power from a power source 202 to a source resonator 210.

The IMN control circuitry 208 monitors impedance differences between the source 202 and the load 206 and provides control signals to the IMN 204 to tune the IMN 204 or components thereof. The IMN control circuitry 208 can monitor voltage or current at various circuit locations within a power transfer system 100 to detect impedance differences. The IMN control circuitry 208 can include phase detection circuitry 209 to detect and compare phases of the monitored voltage or current within the power transfer system 100. For example, a phase difference between current at two locations within the power transfer system 100 may indicate an impedance mismatch. The IMN control circuitry 208 can tune the IMN 204 in response to detecting the phase difference.

For example, referring to FIG. 2B, the IMN control circuitry 208 can receive power, voltage, or current measurements from sensors 212 and 214. Sensors 212 and 214 can be appropriate voltage or current sensors such as, for example, Rogowski coils. For example, sensor 212 can measure an alternating current ($I_S$) provided from the power source 202, and sensor 214 can measure an alternating current ($I_L$) provided to a resonator 210. The phase detection circuitry 209 detects respective phases of the currents $I_S$ and $I_L$. The phase detection circuitry 209 can send the detected phases of currents $I_S$ and $I_L$ to the IMN control circuitry 208 to tune the IMN 204 or components thereof (e.g., components 216, 218, 220) to correct the impedance mismatch.

The IMN 204 components 216, 218, 220 can include, for example, a capacitor or networks of capacitors, an inductor or networks of inductors, or various combinations of capacitors, inductors, diodes, switches, and resistors. The components of the impedance matching network can be adjustable and variable and can be controlled to affect the efficiency and operating point of the system. The impedance matching can be performed by controlling the connection point of the resonator, adjusting the permeability of a magnetic material, controlling a bias field, adjusting the frequency of excitation, and the like. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage and power. The elements can be chosen to be high-Q elements.

Figure 3:
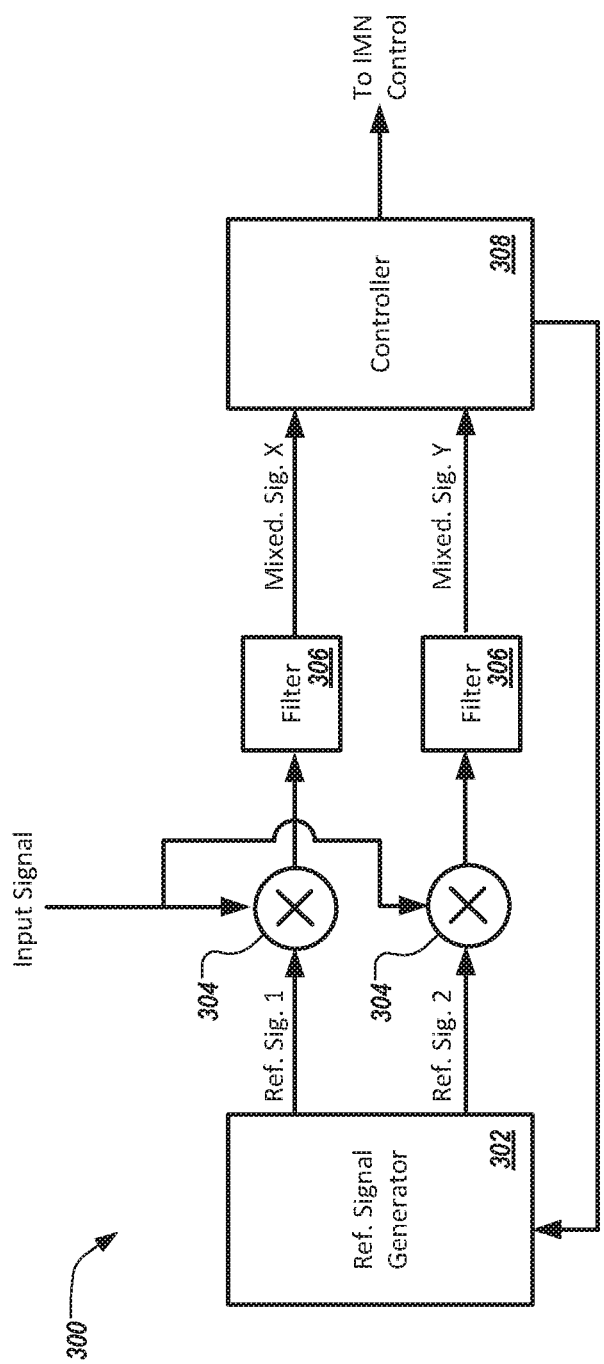
FIG. 3 depicts an example of an implementation of a phase detection device in accordance with implementations of the present disclosure.

FIG. 3 depicts an example of an implementation of a phase detection device 300 that can be included in a power transfer system to detect and monitor phase angles of a voltage or current input signal. The phase detection device 300 is a single input (e.g., single channel) phase detector. That is, the phase detection device 300 measures a phase of an input signal provided on one input channel. The phase detection device 300 includes a signal generator 302, signal mixers 304, filters 306, and a controller 308. The controller 308 can be, for example, a microcontroller, a computer processor, a field programmable logic array (FPGA), or an application specific integrated circuit (ASIC). The controller 308 can include or be coupled to a computer readable storage device such as, for example, random access memory, flash memory, or other appropriate memory device.

During operation of the phase detection device 300, the signal generator 302 generates reference signals 1 and 2. Reference signals 1 and 2 are sinusoidal signals each having a frequency equal to that of an input signal (e.g., 6.78 MHz). Ideally, reference signals 1 and 2 are ninety degrees out of phase with each other. For example, reference signal 1 may be a sine signal represented by $A*\sin(\omega t)$ and reference signal 2 may be a cosine signal represented by $A*\cos(\omega t)$. However, often the reference signals are not exactly ninety degrees out of phase, and the signals include some phase error ($\theta$) (e.g., fractions of a degree to multiple degrees (e.g. 0.1° or less to 10° or more). Thus, reference signals 1 and 2 can be more generally represented by $A*\sin(\omega t)$ and $A*\cos(\omega t+\theta)$, respectively. In some examples, the phase detection device 300 can correct for any phase error ($\theta$) between the reference signals, thereby reducing the precision required in generating the reference signals to obtain accurate phase measurements.

The input signal may be a signal representing a measured current or voltage at a location within a power transfer system. The input signal may be, for example, a voltage signal representing a measured current or voltage at a location within a power transfer system, and can be represented by $A_{IN}*\sin(\omega t+\varphi)$, where $\varphi$ is the phase of the input signal relative to the reference signals. For example, the input signal can be the output of a Rogowski coil positioned within the circuitry of a power transfer system to measure a current signal.

The signal mixers 304 are coupled with the signal generator 302 so as to receive one of the reference signals as one input and the input signal as another input. The mixers 304 mix (e.g., perform time-domain multiplication) a respective reference signal with the input signal and output mixed signal 1 and 2. Thus, mixed signal 1 can be represented by:

$$X = A_{IN}*\sin(\omega t + \varphi)*A*\sin(\omega t) = \frac{AA_{IN}}{2}*\cos(\varphi) - \frac{AA_{IN}}{2}*\cos(2\omega t + \varphi),$$

and mixed signal 2 can be represented by:

$$Y = A_{IN}*\sin(\omega t + \varphi)*A*\cos(\omega t + \theta) = \frac{AA_{IN}}{2}*\sin(\varphi - \theta) + \frac{AA_{IN}}{2}*\sin(2\omega t + \varphi + \theta).$$

Filters 306 can be low-pass filters designed to filter, for example, the second harmonic from the first and the second mixed signal that is generated by the mixers. Accordingly, the filters may remove the second order harmonics generated from the signal mixing process as well as any higher order harmonics that were present in either reference signals or the input signal. After filtering, mixed signal 1 can be represented by:

$$X = \frac{AA_{IN}}{2} * \cos(\varphi),$$

and mixed signal 2 can be represented by:

$$Y = \frac{AA_{IN}}{2} * \sin(\varphi - \theta).$$

The controller 308 receives the mixed signals X and Y, determines the phase of the input signal, and outputs the phase of the input signal to, for example, IMN control circuitry. Without a phase error (θ) between the reference signals, the phase of the input signal (φ) can be calculated by:

$$\varphi = \tan^{-1}\left(\frac{Y}{X}\right) = \tan^{-1}\left(\frac{\frac{AA_{IN}}{2} * \sin(\varphi)}{\frac{AA_{IN}}{2} * \cos(\varphi)}\right).$$

With a phase error (θ) between the reference signals, the calculated effective phase of the input signal ($\varphi_{eff}$) can be represented by:

$$\varphi_{eff} = \tan^{-1}\left(\frac{Y}{X}\right) = \tan^{-1}\left(\frac{\frac{AA_{IN}}{2} * \sin(\varphi - \theta)}{\frac{AA_{IN}}{2} * \cos(\varphi)}\right).$$

Figure 4:
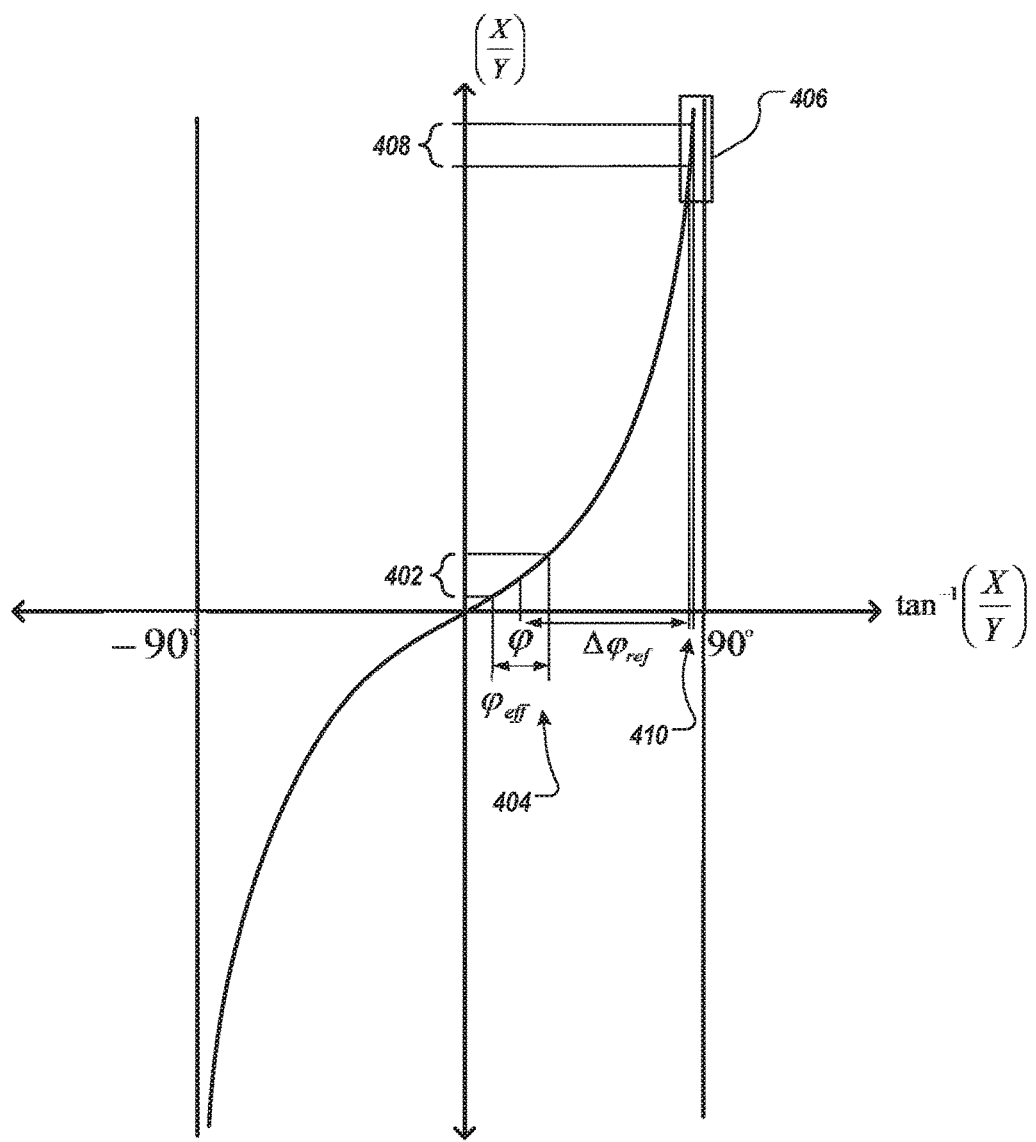
FIG. 4 shows a graph depicting an operation of the phase detection device.

Thus, the phase error (θ) between the reference signals can cause variations in the ratio of the mixed signals X and Y, and consequently, errors in calculating the phase (φ) of the input signal. For example, FIG. 4 shows a graph depicting the tangent function of the phase (φ) of the input signal:

$$\tan(\varphi) = \left(\frac{Y}{X}\right).$$

However, the x- and y-axes are labeled as $$\left(\frac{Y}{X}\right) \text{ and } \tan^{-1}\left(\frac{Y}{X}\right),$$

respectively, to correspond with the operations of the controller 308. Any phase error (θ) between the reference signals causes error 402 in the ratio of the mixed signals X and Y. Although an actual phase (φ) of the input signal may be, for example, 15° a phase error (θ) between the reference signals of, for example, ±10° will cause variation 402 in the ratio $$\left(\frac{Y}{X}\right)$$

or the mixed signals A and Y. Without accounting for the error, calculations of the effective phase ($\varphi_{eff}$) of the input signal from the ratio $$\left(\frac{Y}{X}\right)$$

of the mixed signals may result in a value for the effective phase ($\varphi_{eff}$) falling within a wide error range 404 (e.g., approximately 5.1° to 23.6°) related to the phase error (θ) between the reference signals.

To minimize the effect of any phase error (θ) between the reference signals, the controller 308 shifts the phases of the reference signals until the ratio $$\left(\frac{Y}{X}\right)$$

or the mixed signals falls within a predetermined region 406 of the tangent function curve. For instance, near the asymptotes of the tangent function, any variation 408 in the ratio $$\left(\frac{Y}{X}\right)$$

of the mixed signals caused by the phase error (θ) between the reference signals will have minimal effects on the calculated effective phase ($\varphi_{eff}$) 410 of the input signal. A more accurate calculation of the actual phase (φ) of the input signal can be determined by subtracting the amount the reference signals are shifted from the effective phase ($\varphi_{eff}$) as calculated after the shift.

In more detail, the controller 308 monitors the values of mixed signals X and Y while shifting (e.g., delaying) both of the reference signals by an equal amount ($\Delta\varphi_{ref}$). For example, the controller 308 can send a control signal to the signal generator 302 (or to phase shifting circuitry (not shown)) to create equivalent phase shifts ($\Delta\varphi_{ref}$) in reference signal 1 and reference signal 2. The controller 308 can stop shifting the phase of the reference signals when it determines that the phase shifts ($\Delta\varphi_{ref}$) of the reference signals is sufficient to place the ratio $$\left(\frac{Y}{X}\right)$$

of the mixed signals within the desired region 406 of the tangent curve. For example, the controller 308 can monitor the ratio $$\left(\frac{Y}{X}\right)$$

of the mixed signals and stop phase shifting the reference signals when the ratio $$\left(\frac{Y}{X}\right)$$

meets or exceeds a threshold value. For example, the controller 308 can compare a magnitude of the ratio to a threshold value.

In some implementations, the threshold can be a local maximum value of the ratio $$\left(\frac{Y}{X}\right).$$

For example, the controller 308 can store at least one prior calculated value of the ratio $$\left(\frac{Y}{X}\right)$$

while shifting the reference signals and compare a subsequently calculated value to the prior value. When a subsequent ratio value is less than a prior calculated value, the controller 308 can use the prior calculated value as the local maximum value and its corresponding phase shift of the reference signals as the $\Delta\varphi_{ref}$ for calculating the phase of the input signal.

Once the ratio $$\left(\frac{Y}{X}\right)$$

of the mixed signals meets or exceeds the threshold value, the controller 308 can calculate the phase ($\varphi$) of the input signal based on an amount by which the phase of the reference signals was shifted ($\Delta\varphi_{ref}$) to achieve the threshold value for the ratio $$\left(\frac{Y}{X}\right)$$

of the mixed signals. For example, the phase ($\varphi$) of the input signal can be calculated by subtracting the amount of phase shift in the reference signals ($\Delta\varphi_{ref}$) from the effective phase ($\varphi_{eff}$) of the input signal calculated after the phase shift, for example, as represented by the equation below:

$$\varphi = \varphi_{eff, after\ shift} - \Delta\varphi_{ref} = \tan^{-1}\left(\frac{Y}{X}\right)_{after\ shift} - \Delta\varphi_{ref}.$$

In some implementations, the phase ($\varphi$) of the input signal can be approximated by subtracting the amount by which the reference signals are phase shifted ($\Delta\varphi_{ref}$) from 90°, as represented by the equation below, for example:

$$\varphi_{approx} = 90° - \Delta\varphi_{ref}$$

In some implementations, the controller 308 can send data indicating the calculated phase of the input signal to control circuitry for an IMN (e.g., IMN control circuitry 208 of FIGS. 2A and 2B). In some implementations, controller 308 can serve as both the controller for the phase detection circuitry and as a controller for an IMN. In other words, controller 308 can use the calculated phase of the input signal to generate control signals to tune an IMN or elements thereof.

Figure 5A:
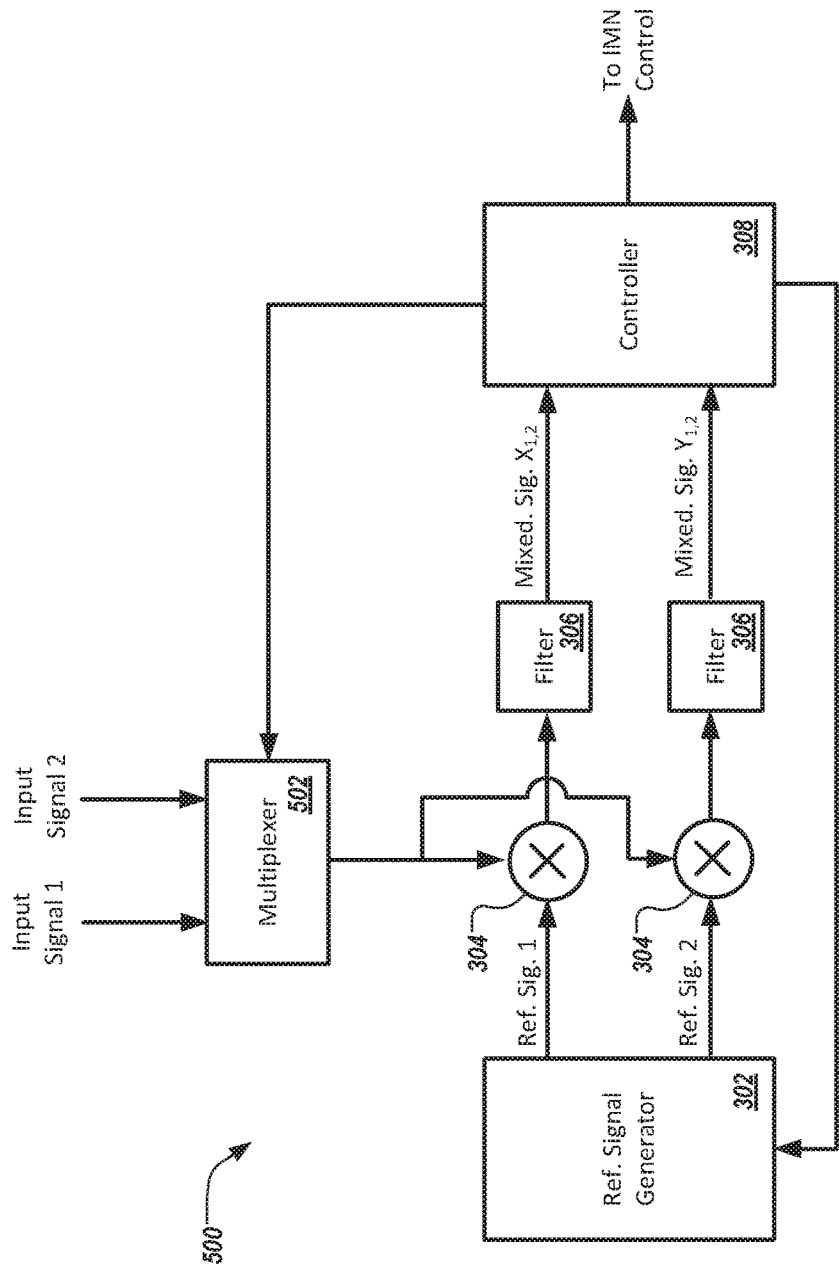
FIGS. 5A and 5B depict examples of implementations of multi-input phase detection devices.
Figure 5B:
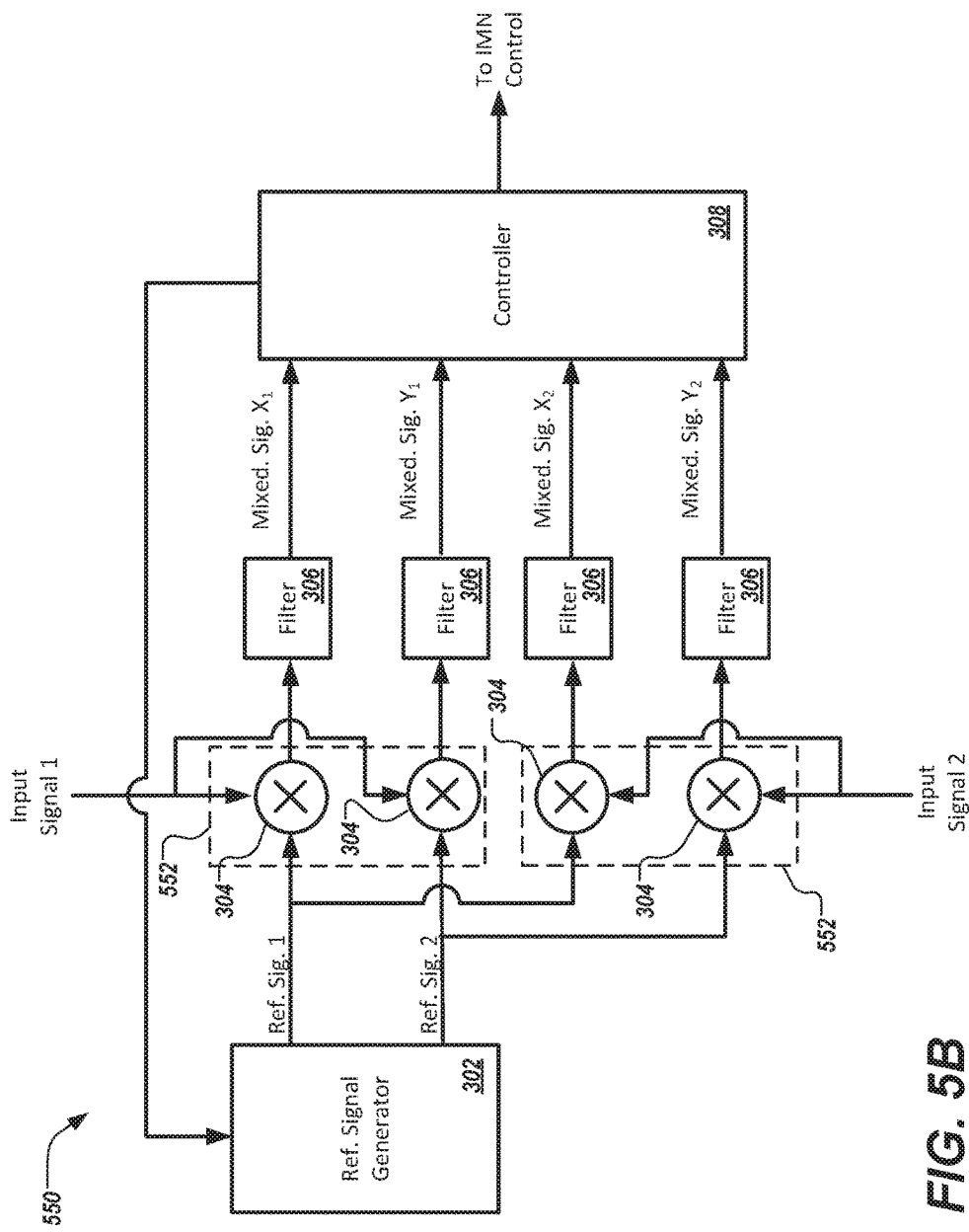

FIGS. 5A and 5B depict examples of implementations of multi-input phase detection devices 500 and 550, respectively, that can be included in a power transfer system to detect and monitor phase angles of voltage or current input signals. More specifically, the multi-input (e.g., multi-channel) phase detection devices 500 and 550 can measure phases of multiple input signals provided on multiple different input channels, or phase differences between various input signals provided on the multiple input channels.

Referring first to FIG. 5A, the phase detection device 500 is similar to that shown in FIG. 3, however, phase detection device 500 includes a multiplexer 502 to alternately monitor multiple input signals. In the example shown, the multiplexer 502 receives two input signals (input signal 1 and input signal 2). The output of the multiplexer is coupled to both of the mixers 304. The controller 308 is coupled with a controlling input terminal (e.g., a signal selection input terminal) of the multiplexer 502.

In the phase detection device 500, the controller 308 can determine a difference in phase between the input signals. For example, the controller 308 can determine the phase of both input signal 1 ($\varphi_1$) and input signal 2 ($\varphi_2$) using the process described above in reference to FIGS. 3 and 4 for each of the input signals. The controller 308 can then calculate the phase difference between the input signals ($\varphi_{diff}$) by finding the difference between the phases of the respective input signals, as represented in the equation $\varphi_{diff} = \varphi_2 - \varphi_1$, for example.

More specifically, in some implementations, the controller 308 can select one of the input signals from the multiplexer 502, for example, input signal 1. The selected input signal is mixed with reference signal 1 and reference signal 2 by the mixers 304 to generate a first set of mixed signals (e.g., $X_1$ and $Y_1$). As described above, the controller 308 can monitor the ratio of the first set of mixed signals while shifting the phase of the reference signals until the ratio of the mixed signals meets or exceeds the threshold value. As described above, the controller 308 can then determine the phase of input signal 1 ($\varphi_1$) by subtracting the value of the reference signal phase shift either from 90°, for an approximate value, or from the arctangent of the ratio of the mixed signals. The controller 308 stores the phase of input signal 1 ($\varphi_1$) and proceeds to determine the phase of input signal 2 ($\varphi_2$) in a similar manner. The controller 308 can then calculate the phase difference between the input signals ($\varphi_{diff}$) by subtracting the phase of one input signal from that of the other. This process can be performed for any number of input signals to obtain phase values for each input signal, and the controller 308 can compare the phases of any one input signal to other input signals as desired or required by a particular system in which the phase detection device 500 is implemented.

In some implementations, the controller 308 can alternately select between the input signals while performing the phase shift of the reference signals and monitoring the ratios of mixed signals generated from each of the respective input signals. For example, the controller 308 can select one of the input signals from the multiplexer 502, for example, input signal 1. As before, the selected input signal is mixed with reference signal 1 and reference signal 2 by the mixers 304 to generate a second set of mixed signals (e.g., X1 and Y1). The controller 308 can determine the ratio of the first set of mixed signals and store the value. The controller 308 can select a different input signal from the multiplexer 502, for example, input signal 2. Once selected, input signal 2 is mixed with reference signal 1 and reference signal 2 by the mixers 304 to generate a second set of mixed signals (e.g., X2 and Y2). The controller 308 can determine the ratio of the second set of mixed signals and store the value. These steps can be repeated for each input signal to the multiplexer 502.

Once a ratio of mixed signals has been determined and stored for each of the input signals (e.g., input signals 1 and 2), the controller 308 can shift the phase of the reference signals by an incremental value (e.g., 2°, 1°, 0.1°, etc.). The controller 308 repeats the above steps of selecting through each of the input signals to the multiplexer 502 and calculating a ratio of mixed signals associated with each input signal. For each input signal, the controller 308 determines whether the ratio of mixed signals at each incremental phase shift of the reference signals meets or exceeds the threshold value. When the ratio of mixed signals for a particular one of the input signals meets or exceeds the threshold value, the controller 308 can calculate the phase of the particular input signal using the corresponding cumulative phase shift in the reference signals. For example, if the ratio of the mixed signals associated with input signal 1 reach the threshold value during the fifth incremental phase shift of the reference signals, the cumulative phase shift corresponding to input signal 1 would be five times the incremental phase shift value. In some implementations, once a phase is calculated for a given input signal the controller may skip over (not select) that input signal for each subsequent iteration of the phase calculation process.

Once the phase of each input signal has been calculated, the controller 308 can calculate the phase difference between the input signals ($\varphi_{diff}$) by subtracting the phase of one input signal from that of the other. Furthermore, this process can be performed for any number of input signals to obtain phase values for each input signal, and the controller 308 can compare the phases of any one input signal to other input signals as desired or required by a particular system in which the phase detection device 500 is implemented.

FIG. 5B depicts another implementation of a multi-input phase detection device 550. The phase detection device 550 includes separate sets 552 of mixers 304 for each input signal (e.g., input signal 1 and input signal 2). Each mixer 304 in each set 552 is coupled to the signal generator 302 to receive one of the reference signals as an input, and both mixers 304 in each set 552 receive a respective one of the inputs signals as a second mixer input.

For example, the set 552 of mixers 304 associated with input signal 1 mix (e.g., perform time-domain multiplication) a respective reference signal with input signal 1 and output a first set of mixed signals $X_1$ and $Y_1$. Likewise, the set 552 of mixers 304 associated with input signal 2 mix (e.g., perform time-domain multiplication) a respective reference signal with input signal 2 and output a second set of mixed signals $X_2$ and $Y_2$.

The controller 308 receives the mixed signals associated with each of the input signals and determines the phase of each input signal. For example, the controller 308 can concurrently monitor the set of mixed signals associated with each of multiple input signals while shifting the phase of the reference signals. The controller 308 can detect when a ratio of each set of mixed signals meets or exceeds the threshold value, and, in response, determine a phase for the input signal corresponding to each set of mixed signals. For example, when the controller 308 determines that the ratio of mixed signals $X_1$ and $Y_1$ associated with input signal 1 meet or exceeds the threshold value, the controller 308 can use the phase shift value corresponding to the amount by which the reference signals were shifted when the ratio of signals $X_1$ and $Y_1$ met or exceed the threshold value to determine the phase of input signal 1. The controller 308 can continue shifting the phase of the reference signals and monitoring the ratio of mixed signals associated with each input signal until the phase for each input signal has been determined.

Once the phase of each input signal has been calculated, the controller 308 can calculate the phase difference between the input signals ($\varphi_{diff}$) by subtracting the phase of one input signal from that of the other. Furthermore, this process can be performed for multiple input signals to obtain phase values for each input signal, with a corresponding number of mixer sets 552. Moreover, the controller 308 can compare the phases of any one input signal to other input signals as desired or required by a particular system in which the phase detection device 550 is implemented.

In some implementations, the controller 308 in phase detection devices 500 or 550 can send data indicating the calculated phase difference between two of the multiple input signals to control circuitry for an IMN (e.g., IMN control circuitry 208 of FIGS. 2A and 2B). In some implementations, controller 308 can serve as both the controller for the phase detection circuitry and as a controller for an IMN. In other words, controller 308 can use calculated phase differences of the input signals to generate control signals to tune an IMN or elements thereof.

Figure 6:
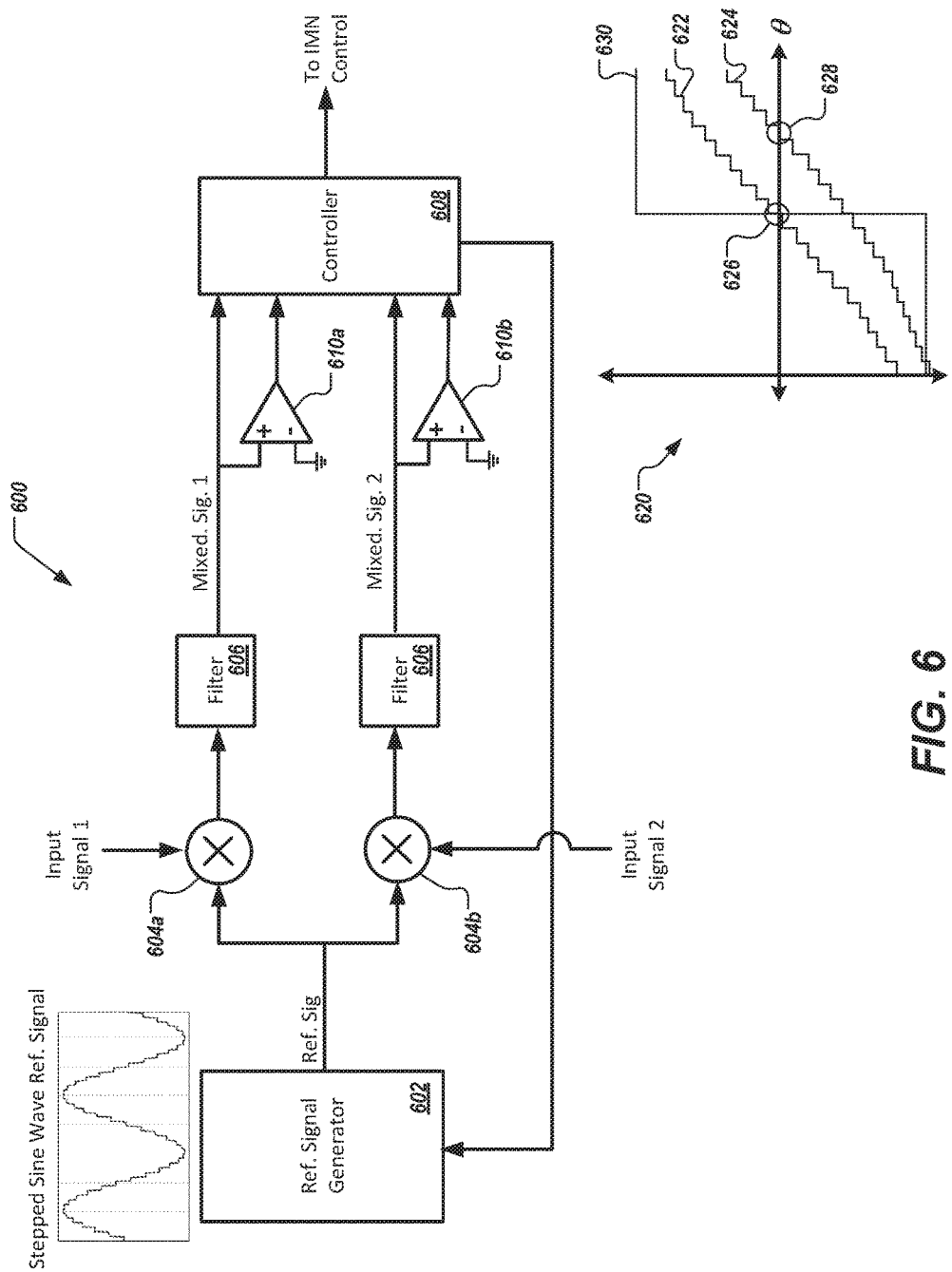
FIG. 6 depicts an example of an implementation of a phase detection device in accordance with implementations of the present disclosure.

FIG. 6 depicts an example of a phase detection device 600 that can be included in a power transfer system to detect and monitor phase angles between voltage or current input signals. The phase detection device 600 is a dual input (e.g., two channel) phase difference detector. That is, the phase detection device 600 measures a phase difference between two input signals, one input signal provided on each of two input channels. The phase detection device 600 includes a signal generator 602, signal mixers 604a, 604b, and a controller 608. Filters 606 may be included between respective outputs of the mixers 604a, 604b and inputs terminals of the controller 608. The controller 608 can be, for example, a microcontroller, a computer processor, an FPGA, or an ASIC. The controller 608 can include or be coupled to a computer readable storage device such as, for example, random access memory, flash memory, or other appropriate memory devices. In some implementations, the phase detection device 600 can also include comparators 610a and 610b.

During operation of the phase detection device 600, the signal generator 602 generates a reference signal. The reference signal has a frequency equal to that of an input signals (e.g., 6.78 MHz). In some examples, the reference signal can be a stepped sine wave, and can be represented as $A \sin(\omega t + \theta)$, where the phase ($\theta$) of the reference signal is controllable in discrete steps having a step size ($\Delta\theta$). Thus, an aggregate phase shift of the reference signal can be represented by $n(\Delta\theta)$, where n represents a number of steps by which the phase of the reference signal is shifted. For example, the reference signal can be a 192-step sine wave with a step size of 1.875° (360°/192 steps). Therefore, a phase shift of ten steps (e.g., n=10) would be the equivalent of 18.75°.

The input signals may be signals representing measured current or voltage signals at locations within a power transfer system. The input signals may be, for example, voltage signals representing measured current or voltage at locations within a power transfer system. For example, input signal 1 (e.g., on channel 1) can be represented as $A_1$ sin(ωt+φ₁), and input signal 2 (e.g., on channel 2) can be represented as A₂ sin(ωt+φ₂). For example, the input signals can be the outputs of Rogowski coils positioned within the circuitry of a power transfer system to measure current at locations within the system.

The signal mixers 604a, 604b are coupled with the signal generator 602 so as to receive the reference signal as one input and one of the input signals as a, respective, second input. Mixer 604a mixes (e.g., performs time-domain multiplication of) the reference signal with input signal 1, and outputs mixed signal 1. Mixer 604b mixes the reference signal with input signal 2, and outputs mixed signal 2.

Filters 606 are low-pass filters designed to filter higher-order second harmonics from the mixed signals generated by the mixers, leaving only the DC component. The filters remove the second order harmonics generated from the signal mixing process and any higher order harmonics that were present in either reference signal or the input signals. After filtering, mixed signal 1 can be represented by:

$$\text{Mixed Sig. } 1 = \frac{AA_1}{2} * \cos(\varphi_1 - \theta),$$

and mixed signal 2 can be represented by:

$$\text{Mixed Sig. } 2 = \frac{AA_2}{2} * \sin(\varphi_2 - \theta).$$

The controller 608 receives the mixed signals 1 and 2 and shifts the phase of the reference signal while monitoring the mixed signals to determine the phase difference between the input signals. More specifically, the controller shifts the phase of the reference signal while monitoring mixed signal 1 and mixed signal 2 for a zero crossing. For example, the controller can incrementally shift the phase of the references signal while monitoring the values of the mixed signals 1 and 2. When the controller 608 detects that the value of one of the mixed signals (e.g., mixed signal 1) equals or has passed through zero while shifting the phase of the reference signal, the controller 608 stores data representing the phase of the reference signal at which the zero crossing of mixed signal 1 occurs. The controller 608 may store data representing the phase increment of the reference signal either just before or just after the zero crossing, so long as the same convention is used consistently. In some implementations, more precision may be achieved by interpolating a more precise time of the zero crossing between the phase increments of the reference signal just before and just after the zero crossing.

The controller 608 continues to shift the phase of the reference signal (θ) while monitoring the mixed signals. When the controller 608 detects that the value of the other mixed signal (e.g., mixed signal 2) equals or has passed through zero while shifting the phase of the reference signal, the controller 608 stores data representing the phase of the reference signal at which the zero crossing of mixed signal 2 occurs. The phase difference between the two input signals can then be determined by finding the difference between the phase of the reference signal at the zero crossing for each of the mixed signals.

For example, as the controller 608 shifts the phase of the reference signal (θ) the value of mixed signals 1 and 2 may change as shown in plot 620, where curves 622 and 624 represent the values of mixed signals 1 and 2 as a function of the phase of the reference signal (θ). When the controller 608 detects zero crossing 626 of mixed signal 1, the controller 608 stores the data representing the phase of the reference signal at which the zero crossing 626 occurs. The controller 608 continues to shift the phase of the reference signal (θ) while monitoring the mixed signals. When the controller 608 detects zero crossing 268 of mixed signal 2, the controller 608 stores the data representing the phase of the reference signal at which the zero crossing 268 occurs. The controller 608 determines the phase difference between the two input signals by subtracting the phase of the reference signal at the zero crossing 628 of mixed signal 2 from the phase of the reference signal at the zero crossing 626 of mixed signal 1.

In some implementations, the exact phases of the reference signal at the zero crossings is not required. The controller 608 only needs data representing the amount by which the phase of the reference signal is shifted between the zero crossings of the mixed signals. As noted above, in some implementations, the reference signal can be a stepped-sinusoidal signal, for example, a 192-step sine wave with a step size of 1.875°). In such implementations, the actual phase of the reference signal is not required to determine the phase difference between the two input signals.

For example, the controller 608 can use an arbitrary starting state for the phase of the reference signal such as, a binary count beginning at zero (e.g., 00000000$_b$) to represent the number of steps by which the reference signal is shifted. The controller 608 causes the signal generator 602 to incrementally shift the reference signal and counts each step by incrementing the binary count. The controller 608 can detect zero crossing 626 of mixed signal 1 at step eight (e.g., 00001000$_b$). Then, the controller 608 can detect zero crossing 628 of mixed signal 2 at step 24 (e.g., 00011000$_b$). The controller 608 can determine the phase angle between the two input signals as the difference in step count at each zero crossing times the step size of the reference signal. For example, $\Delta\varphi_{2,1}=(24-8)*1.875°=30°$. Furthermore, in this example, the data representing the phase of the reference signal at each zero crossing is the binary count value of the phase shift when the zero crossing is detected.

In some implementations, the controller 608 can continuously shift the phase of the reference signal at a constant rate and store the times at which the zero crossings occur. In such implementations, the data representing the phase of the reference signal at each zero crossing are the stored times. Then, the phase angle between the two input signals is the time difference between the two zero crossings multiplied by the phase shift rate of the reference signal. In some implementations, controller 608 can continuously shift the phase of the reference signal at a constant rate, start a timer when the first zero crossing is detected and record the value of the timer when the second zero crossing is detected. In such implementations, the phase angle between the two input signals is the timer value at the second zero crossing multiplied by the phase shift rate of the reference signal.

In some implementations, each input channel can include a comparator 610a, 610b coupled to the output of the respective signal mixer 604a or 604b, and to an input terminal of the controller 608. The comparators 610a, 610b can be used to detect the respective mixed signal zero crossings. For example, the comparators 610a, 610b can be connected to compare a respective mixed signal to zero (e.g., ground). The output of each comparator 610a, 610b is coupled to the controller 608, and the controller detects the mixed signal zero crossings (e.g., 626, 628) by detecting a rising edge on the output of a respective comparator 610a, 610b.

For example, curve 630 in the plot 620 shows an example output from comparator 610a in response to mixed signal 1 (e.g. curve 622). In this case, the comparator 610a shifts from positive to a negative value at the zero crossing 626 forming a rising edge. The controller 608 can detect the rising edge of the comparator 610a output and, in response, store data representing the phase of the reference signal when the rising edge is detected. Although plot 620 illustrates a rising edge, some implementations can detect zero crossing using a falling edge of a comparator output signal or both falling and rising edges.

In some implementations, the controller 608 can send data indicating the calculated phase difference between two of the input signals to control circuitry for an IMN (e.g., IMN control circuitry 208 of FIGS. 2A and 2B). In some implementations, controller 608 can serve as both the controller for the phase detection circuitry and as a controller for an IMN. In other words, controller 608 can use the calculated phase of the input signal to generate control signals to tune an IMN or elements thereof.

Figure 7:
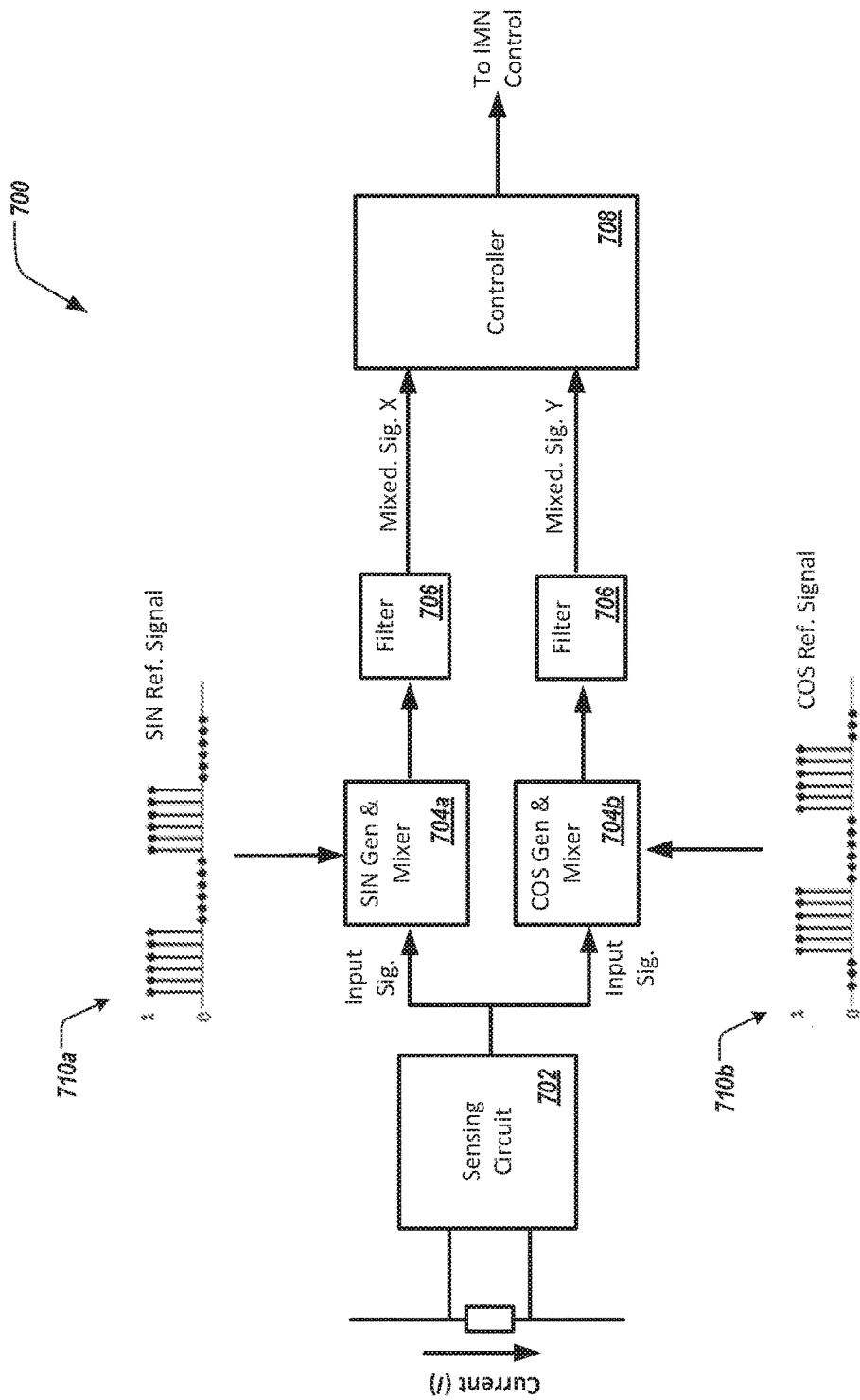
FIG. 7 depicts another example of a phase detection device in accordance with implementations of the present disclosure.

FIG. 7 depicts another example of a phase detection device 700 that can be included in a power transfer system to detect and monitor a phase angle of a voltage or current input signal. The phase detection device 700 is a single input (e.g., single channel) phase detector. That is, the phase detection device 700 measures a phase of an input signal provided on one input channel. The phase detection device 700 includes sensing circuit 702, a sine wave generator/signal mixer 704a, a cosine wave generator/signal mixer 704b, filters 706, and a controller 708. The sensing circuit 702 is a circuit designed to measure a current or voltage signal. For example, the sensing circuit 702 can be a Rogowski coil.

The sine wave generator/signal mixer 704a and the cosine wave generator/signal mixer 704b are finite impulse response (FIR) filters that are configured to generate a sinusoidal signal from a non-sinusoidal reference signal (e.g., a square wave) 710a, 710b, and to mix the generated sinusoidal signal with an input signal. The sine wave generator/signal mixer 704a and the cosine wave generator/signal mixer 704b can each generally be referred to as a sinusoidal wave generators/signal mixer (SWG/SM). As described in more detail below, the sine wave generator/signal mixer 704a and the cosine wave generator/signal mixer 704b can have the same structure, with the difference between the two being the phase of the reference signals 710a, 710b received by the respective SWG/SMs 704a, 704b.

The controller 708 can be, for example, a microcontroller, a computer processor, an FPGA, or an ASIC. The controller 708 can include or be coupled to a computer readable storage device such as, for example, random access memory, flash memory, or other appropriate memory devices.

During operation of the phase detection device 700, the sensing circuit 702 measures a current or voltage signal. For example, the sensing circuit 702 can measure a current at one or more locations within a power transfer system (e.g., a 6.78 MHz alternating current (AC) signal). The output signal of the sensing circuit 702 can be a voltage signals representing a measured current or voltage. For example, output signal of the sensing circuit 702 can be represented as $A_{IN} \sin(\omega t+\varphi)$. In addition, the output signal of the sensing circuit 702 is the input signal for the SWG/SMs 704a, 704b. For example, the input signal for the SWG/SMs 704a, 704b can be the outputs of Rogowski coils positioned within the circuitry of a power transfer system to measure current at locations within the system. In some examples, the sensing circuit 702 can amplify or filter a measured signal. In some examples, the sensing circuit 702 can buffer the input signal of the sensing circuit 702 from the output signal of the sensing circuit 702.

The sine SWG/SM 704a receives the SIN reference signal 710a as a reference signal and the output signal of the sensing circuit 702 as an input signal. In like manner, the cosine SWG/SM 704b receives the COS reference signal 710b as a reference signal and the output signal of the sensing circuit 702 as an input signal. The SIN and COS reference signals 710a, 710b can be, for example, square waves each having a fundamental frequency equal to the frequency of the input signal (e.g., 6.78 MHz). In some examples, the SIN and COS reference signals 710a, 710b are identical except for being 90° out of phase with each other.

The sine SWG/SM 704a filters the SIN reference signal 710a to generate a sinusoidal signal. For example, the sine SWG/SM 704a is configured to cancel higher-order harmonics of the SIN reference signal 710a so as to generate a sinusoidal signal (e.g., $A \sin(\omega t)$) at the fundamental frequency of the SIN reference signal 710a. For example, the sine SWG/SM 704a can be configured to cancel higher-order harmonics of a square wave (e.g., the third, fifth, seventh, and ninth harmonics). For example, the FIR filter zeros (e.g., filter coefficients) can be selected to cancel harmonic frequencies of the SIN reference signal 710a. The sine SWG/SM 704a also mixes (e.g., performs time-domain multiplication of) the sinusoidal signal with the input signal, and outputs mixed signal 1.

The cosine SWG/SM 704b filters the COS reference signal 710b to generate a sinusoidal signal. For example, the cosine SWG/SM 704b is configured to cancel higher-order harmonics of the COS reference signal 710b so as to generate a sinusoidal signal (e.g., $A \cos(\omega t)$) at the fundamental frequency of the COS reference signal 710b. For example, the cosine SWG/SM 704b can be configured to cancel higher-order harmonics of a square wave (e.g., the third, fifth, seventh, and ninth harmonics). For example, the FIR filter zeros (e.g., filter coefficients) can be selected to cancel harmonic frequencies of the COS reference signal 710b. The cosine SWG/SM 704b also mixes (e.g., performs time-domain multiplication of) the sinusoidal signal with the input signal, and outputs mixed signal 2.

Filters 706 are low-pass filters designed to filter higher-order harmonics (e.g., a heterodyned second-order harmonic generated by the mixing process) from the mixed signals generated by the SWG/SMs 704a, 704b, leaving only the DC component. In addition, the filters 706 can remove the second order harmonics generated from the signal mixing process and any higher order harmonics that were present in either reference signal or the input signals. Generally, after filtering, mixed signal X can be represented by:

$$\text{Mixed Sig. } X = \frac{AA_{IN}}{2} * \cos(\varphi),$$

and mixed signal 2 can be represented by:

$$\text{Mixed Sig. } Y = \frac{AA_{IN}}{2} * \sin(\varphi).$$

In some examples, the gain of the SWG/SMs 704a, 704b, the gain of the filters 706, the amplitude of the reference signals 710a, 710b, or a combination of such, can be configured such that the ½ magnitude reduction due to mixing and the amplitude (A) of the sinusoidal signals cancel. Thus, after filtering, mixed signal X can be represented by:

Mixed Sig. $X = A_{IN} * \cos(\varphi)$, and mixed signal Y can be represented by:

Mixed Sig. $Y = A_{IN} * \sin(\varphi)$.

The controller 708 receives the mixed signals X and Y, and can determine one or more characteristics of the input signal based on the mixed signals X and Y. The controller 708 can determine the phase of the input signal ($\varphi$), the amplitude of the input signal ($A_{IN}$), or both. The controller 708 outputs the determined characteristic(s) of the input signal to, for example, IMN control circuitry. For example, the phase of the input signal ($\varphi$) can be calculated by:

$$\varphi = \tan^{-1}\left(\frac{\text{Mixed Sig. } Y}{\text{Mixed Sig. } X}\right) = \tan^{-1}\left(\frac{A_{IN} * \sin(\varphi)}{A_{IN} * \cos(\varphi)}\right).$$

In addition, the amplitude of the input signal ($A_{IN}$) can be calculated by:

$$A_{IN} = \sqrt{(\text{MixedSig.}X)^2 + (\text{MixedSig.}Y)^2}.$$

In some implementations, the SIN and COS reference signals 710a, 710b can be time-sampled signals. In some examples, the reference signals 710a, 710b are sampled at twelve times the fundamental frequency of the reference signals 710a, 710b. In some examples, the COS reference signal 710b can be generated from the SIN reference signal 710a by shifting the SIN reference signal 710a by a predetermined number of samples. For example, if the reference signals 710a, 710b are sampled at twelve times the fundamental frequency, a shift of three samples between the reference signals 710a, 710b would be equivalent to a 90° phase shift (e.g., within reasonable error tolerances).

In some implementations, the controller 708 can send data indicating the calculated phase of the input signal to control circuitry for an IMN (e.g., IMN control circuitry 208 of FIGS. 2A and 2B). In some implementations, controller 708 can serve as both the controller for the phase detection circuitry and as a controller for an IMN. In other words, controller 708 can use the calculated phase of the input signal to generate control signals to tune an IMN or elements thereof.

In some examples, the phase detection device 700 can be implemented as a multi-input phase detection device. More specifically, a multi-input (e.g., multi-channel) phase detection device 700 can measure characteristics of multiple input signals provided on multiple different input channels, or phase differences between various input signals provided on the multiple input channels.

For example, a multi-input phase detection device 700, the circuitry shown in FIG. 7 (with the exception of the controller 708) can be replicated for each input channel. Each input channel can be coupled to the controller 708 and can generate a set of mixed signals (e.g., Mixed Sig. $X_n$ and Mixed Sig. $Y_n$) corresponding to a respective one of the multiple input signals (e.g., Input Signal n). The controller 708 can determine a difference in phase between input signals. For example, the controller 708 can determine the phase of both input signal 1 ($\varphi_1$) and input signal 2 ($\varphi_2$) by performing the process described above in reference to FIG. 7 for each of the input signals. The controller 708 can then calculate the phase difference between the input signals ($\varphi_{diff}$) by finding the difference between the phases of the respective input signals, as represented by the equation $\varphi_{diff} = \varphi_2 - \varphi_1$, for example.

In such implementations, the controller 708 can send data indicating the calculated phase difference between two of the multiple input signals to control circuitry for an IMN (e.g., IMN control circuitry 208 of FIGS. 2A and 2B). In some implementations, controller 708 can serve as both the controller for the phase detection circuitry and as a controller for an IMN. In other words, controller 708 can use calculated phase differences of the input signals to generate control signals to tune an IMN or elements thereof.

Figure 8:
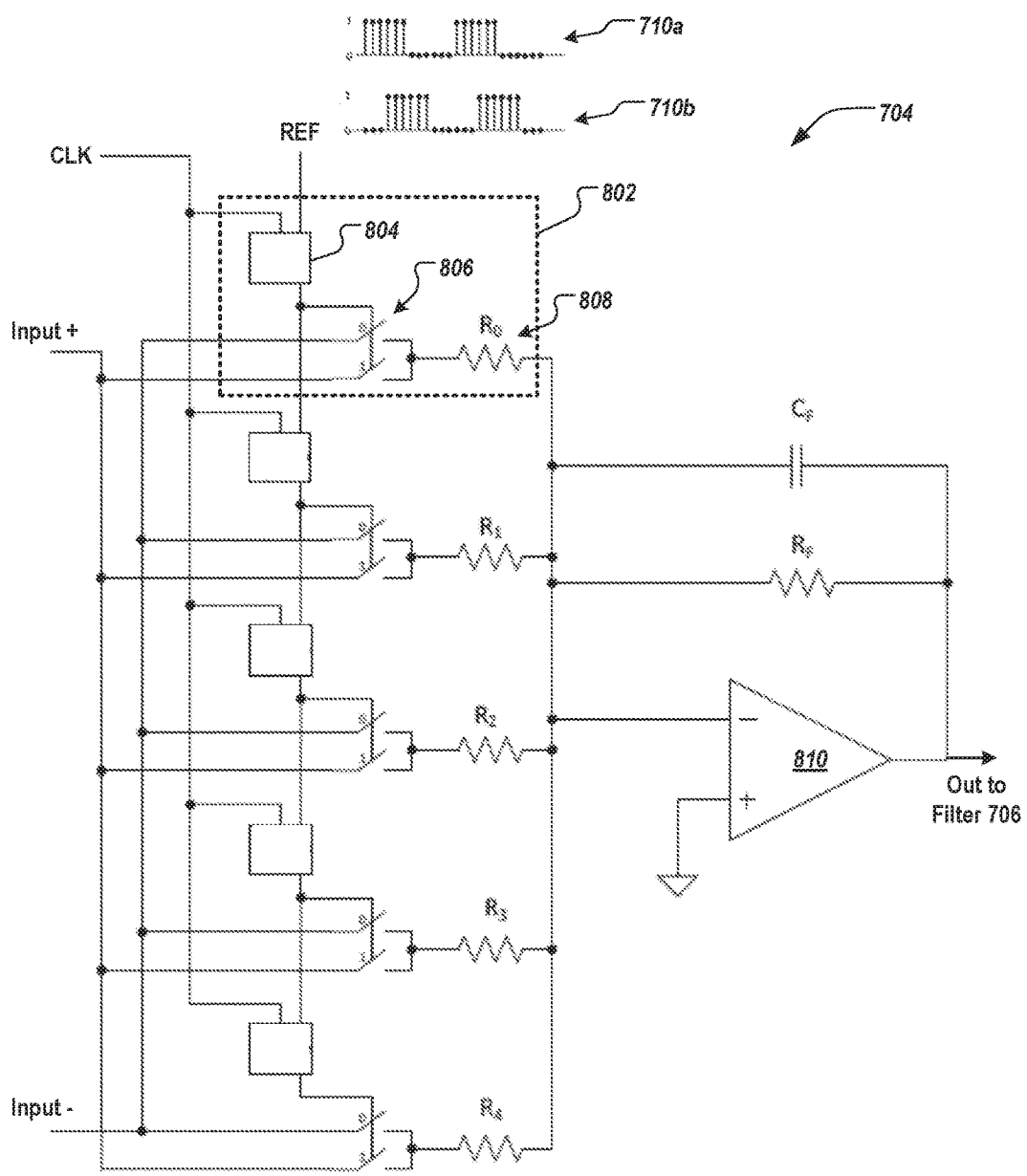
FIGS. 8 and 9 depict examples of sinusoidal wave generators/signal mixers (SWG/SM) in accordance with implementations of the present disclosure.
Figure 9:
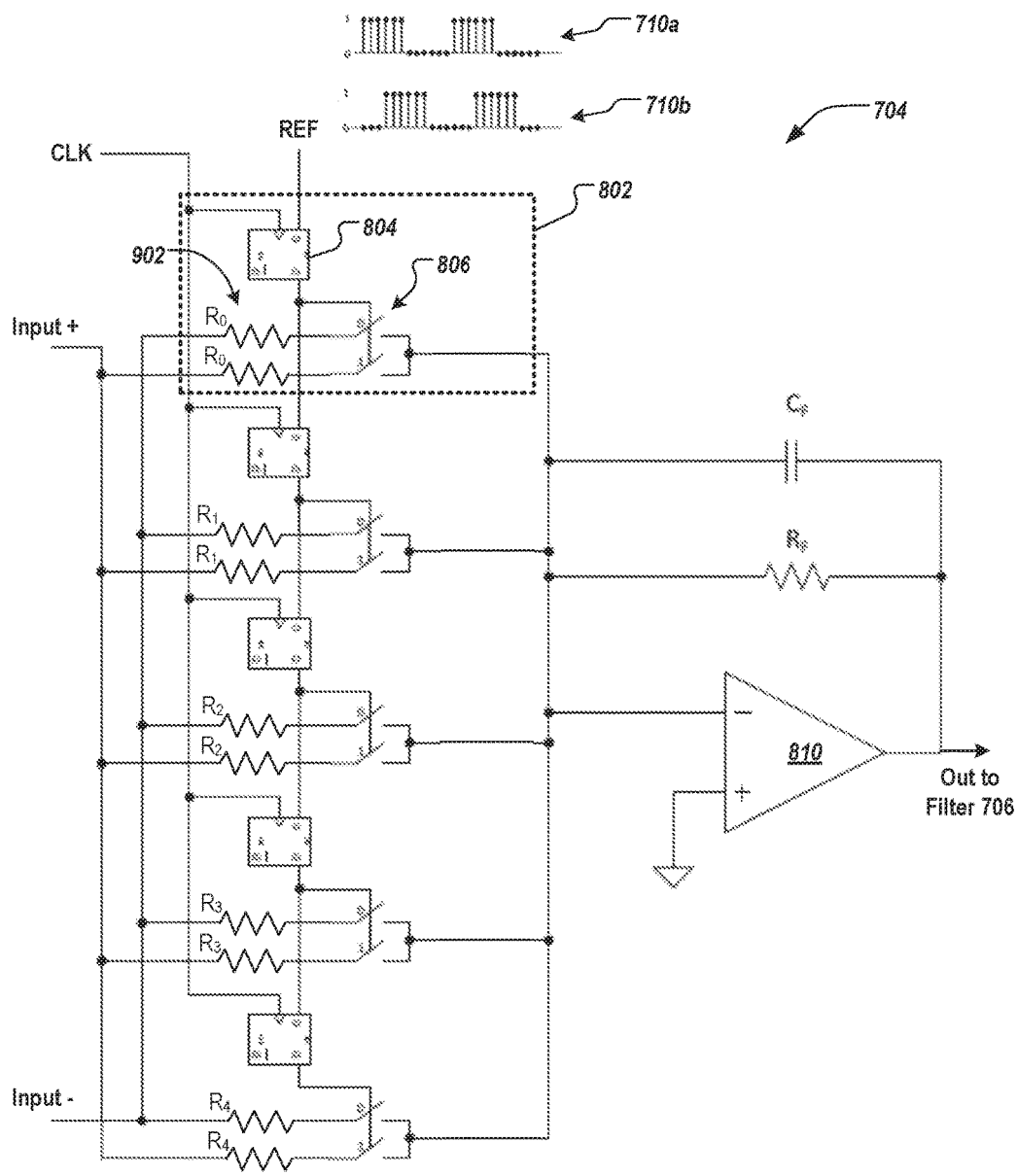

FIGS. 8 and 9 depict examples of SWG/SMs 704 in accordance with implementations of the present disclosure. Referring first to FIG. 8, the SWG/SM 704 is a FIR filter that is configured to generate a sinusoidal signal from a non-sinusoidal reference signal REF (e.g., square wave reference signal 710a, 710b), and to mix the generated sinusoidal signal with an input signal. The SWG/SM 704 includes a plurality of filter taps 802. Each filter tap 802 includes a delay circuit 804 (e.g. a gated latch circuit, a flip-flop, an edge triggered D flip-flop), a switch or switches 806 (e.g., transistor(s)), and a resistor 808 (e.g., resistors $R_0$ through $R_4$). The filter taps 802 are connected to each other sequentially such that the reference signal REF is sequentially delayed by corresponding delay circuits 804 of each filter tap 802. The input signal to the SWG/SM 704 is passed to each filter tap 802. In some examples the input signal is passed using high (Input +) and low (Input −) input signal lines. In addition, each filter tap 802 receives a clock signal CLK from a clock signal line. The clock signal line is electrically connected to a clock input terminal of the delay circuit 804 in each filter tap 802.

In each filter tap 802, an output terminal of the delay circuit 804 is electrically connected to a control terminal of the switch 806. The input signal is passed through the switch 806 and the resistor 808. The output signal from the delay circuit 804 (i.e., the delayed reference signal REF) controls the switch 806. In implementations having high (Input +) and low (Input −) input signal lines, each filter tap 802 can include two switches 806; one connected to each input signal line (Input + and Input −). In such implementations, the switches 806 can be alternately opened and closed based on the delayed reference signal REF. For example, as indicated by the 0 next to the switch 806 connected to the Input − line and the 1 next to the switch 806 connected to the Input + line, the one switch can be closed when the delayed reference signal REF is low and the other switch can be closed when the delayed reference signal REF is high. Thus, the two switches 806 can alternately pass the high or low input signal based on the value of the delayed reference signal REF.

The values of the resistors 808 define the series (e.g., filter coefficients) of the FIR filter. The value of each resistor ($R_0$ through $R_4$) 806 is selected to cancel harmonic frequencies of the reference signal REF in order to generate the sinusoidal signal that is mixed with the input signal. For example, a square wave is composed of a series of odd harmonics of a sinusoidal signal at the fundamental frequency of the square wave. In order to generate a sinusoidal signal at the fundamental frequency of the square wave, the resistor values can be selected to cancel the odd harmonic signals greater than the fundamental frequency. The number of harmonic signals canceled by the FIR filter zeros depends on the number of filter taps 802 included in the SWG/SM 704. For example, as shown in FIG. 8, the SWG/SM 704 includes five filter taps 802, and the resistors 808 can be selected to cancel the third, fifth, seventh, and ninth harmonics of the reference signal. Thus, the first harmonic (e.g., a sinusoid at the fundamental frequency) and the eleventh and greater harmonics will be left. In some cases, power of the higher order harmonics (e.g., the eleventh and above) may be of sufficiently low power that additional filter taps are not justified for a given application. Thus, depending on the precision required by a given implementation, the SWG/SM 704 can be built with more or fewer filter taps 802.

In addition, an output terminal of each filter tap 802 is electrically connected to an inverting input terminal of an operational amplifier 810. A feedback resistor ($R_f$) is provided between the output terminal of the operational amplifier 810 and the inverting input terminal of the operational amplifier 810. The value of the feedback resistor ($R_f$) defines the gain of the FIR filter. The non-inverting input terminal of the operational amplifier 810 is electrically connected to ground. In some implementations, a feedback capacitor (Cf) is also provided between the output terminal of the operational amplifier 810 and the inverting input terminal of the operational amplifier 810. The value of the feedback capacitor (Cf) can provide additional filtering capabilities (e.g., as a low pass filter).

FIG. 9 shows another implementation of the SWG/SM 704. The resistor 808 (shown in FIG. 8) in each filter tap 802 has been replaced by two equivalent resistors 902 (shown in FIG. 9) on the opposite side of the switches 806. The two resistors 902 in a filter tap 802 each have the same resistance value, but the resistance values ($R_0$ through $R_4$) differ between resistors in different filter taps 802. As with the SWG/SM 704 of FIG. 8, the resistances ($R_0$ through $R_4$) are selected so as produce filter zeros that cancel harmonic frequencies of the reference signal REF.

In some implementations, SWG/SM 704 can be operated as a sinusoidal signal generator. For example, a direct current (DC) signal can be provided as the input signal to the SWG/SM 704. When a DC signal is provided as an input signal to the SWG/SM 704, the mixing function is effectively bypassed and the SWG/SM 704 operates as a signal generator by filtering the higher order harmonics of the reference signal REF and outputs a sinusoidal signal at the fundamental frequency of the reference signal REF. In such implementations, the sinusoidal output signal of the SWG/SM 704 can be used as a local oscillator (LO) for a circuit. Furthermore, the sinusoidal output signal of the SWG/SM 704 can be accurately phase shifted by shifting a time-sampled reference signal REF by a particular number of samples. Moreover, phase shift precision (e.g., phase shift increment size) can be increased or decreased by increasing or decreasing the sampling rate of the reference signal REF.

For illustrative purposes, the foregoing description focuses on the use of devices, components, and methods in desktop wireless power transfer applications, e.g., power transfer to electronic devices such as laptops, smartphones, and other mobile electronic devices that are commonly placed on desktops, tabletops, and other user work surfaces. More generally, however, it should be understood that devices that can receive power using the devices, components, and methods disclosed herein can include a wide range of electrical devices, and are not limited to those devices described for illustrative purposes herein. In general, any portable electronic device, such as a cell phone, keyboard, mouse, radio, camera, mobile handset, headset, watch, headphones, dongles, multifunction cards, food and drink accessories, and the like, and any workspace electronic devices such as printers, clocks, lamps, headphones, external drives, projectors, digital photo frames, additional displays, and the like, can receive power wirelessly using the devices, components, and methods disclosed herein. Furthermore, any electrical device, such as electric or hybrid vehicles, motorized wheel chairs, scooters, power tools, and the like, can receive power wirelessly using the devices, components, and methods disclosed herein. In addition the devices, components, and methods disclosed herein may be used for applications outside of wireless power transfer, for example, power factor correction devices, handheld signal analyzers, and the like.

In this disclosure, certain circuit or system components such as capacitors, inductors, resistors, diodes, and switches, are referred to as circuit "components" or "elements." The disclosure also refers to series and parallel combinations of these components or elements as elements, networks, topologies, circuits, and the like. Further, combinations of capacitors, diodes, transistors, and/or switches are described. More generally, however, where a single component or a specific network of components is described herein, it should be understood that alternative embodiments may include networks for elements, alternative networks, and/or the like.

As used herein, the term "coupled" when referring to circuit or system components is used to describe an appropriate, wired or wireless, direct or indirect, connection between one or more components through which information or signals can be passed from one component to another.

As used herein, the term "direct connection" or "directly connected," refers to a direct connection between two elements where the elements are connected with no intervening active elements between them. The term "electrically connected" or "electrical connection," refers to an electrical connection between two elements where the elements are connected such that the elements have a common potential. In addition, a connection between a first component and a terminal of a second component means that there is a path between the first component and the terminal that does not pass through the second component.

The embodiments described herein merely serve to illustrate, but not limit, the features of the disclosure. Other embodiments are also within the scope of the disclosure.

What is claimed is:

1. An electronic device comprising:
   a first finite impulse response (FIR) filter that receives an input signal and a first reference signal, wherein the first FIR filter filters the first reference signal to generate a first sinusoidal signal and mixes the first sinusoidal signal and the input signal to generate a first mixed signal;
   a second FIR filter that receives the input signal and a second reference signal, wherein the second FIR filter filters the second reference signal to generate a second sinusoidal signal and mixes the second sinusoidal signal and the input signal to generate a second mixed signal; and
   a controller coupled with the first FIR filter and the second FIR filter, the controller configured to determine a characteristic of the input signal based on the first mixed signal and the second mixed signal.

2. The electronic device of claim 1, wherein the characteristic of the input signal is a phase or an amplitude of the input signal.

3. The electronic device of claim 1, wherein the characteristic of the input signal includes both a phase and an amplitude of the input signal.

4. The electronic device of claim 1, wherein the first and second reference signals are square waves.

5. The electronic device of claim 4, wherein the square waves are time-sampled square waves.

6. The electronic device of claim 5, wherein a sampling rate of the square waves is twelve times a fundamental frequency of the square wave.

7. The electronic device of claim 5, wherein the first reference signal is phase shifted with respect to the second reference signal by a predetermined number of samples.

8. The electronic device of claim 4, wherein each of the first and the second FIR filter comprises a plurality of filter zeros, and the filter zeros are selected to cancel harmonic frequencies of the first or second reference signal.

9. The electronic device of claim 8, wherein zeros of each of the first and the second FIR filter are selected to cancel third, fifth, seventh, and ninth harmonics of the first or second reference signal.

10. The electronic device of claim 1, wherein each of the first and the second FIR filter comprises a plurality of filter taps, each filter tap comprising:
a delay circuit;
a switch; and
a resistor electrically connected to a terminal of the switch,
wherein one of the first or the second reference signal is applied to an input of the delay circuit,
wherein the switch is controlled by an output of the delay circuit, and
wherein the input signal passes through the switch.

11. The electronic device of claim 10, wherein values for the resistors of the plurality of filter taps for each of the first and second FIR filters represent filter zeros that are selected to cancel harmonic frequencies of the first or second reference signal.

12. The electronic device of claim 10, wherein each of the first and the second FIR filters comprises five filter taps.

13. The electronic device of claim 1, wherein determining the phase of the input signal comprises determining an arctangent of a quotient of the second mixed signal divided by the first mixed signal.

14. The electronic device of claim 1, further comprising:
a first filter coupled with the first FIR filter and the controller, wherein the first filter filters the first mixed signal such that the first mixed signal is a direct current (DC) signal; and
a second filter coupled with the second FIR filter and the controller, wherein the second filter filters the second mixed signal such that the second mixed signal is a DC signal.

15. The electronic device of claim 1, wherein the controller is one of: a microcontroller, a computer processor, a field programmable logic array (FPGA), or an application specific integrated circuit (ASIC).

16. The electronic device of claim 1, wherein the controller is further configured to provide data indicating the phase of the input signal to an impedance matching network.

17. The electronic device of claim 1, further comprising: an impedance matching network coupled with the controller, wherein the impedance matching network is configured to receive data indicating the phase of the input signal from the controller and adjust an impedance value of a resonator in accordance with the received data.

18. The electronic device of claim 1, further comprising:
a third FIR filter that receives a second input signal and the first reference signal, wherein the third FIR filter filters the first reference signal to generate a first sinusoidal signal and mixes the first sinusoidal signal and the second input signal to generate a third mixed signal;
a fourth FIR filter that receives the second input signal and the second reference signal, wherein the fourth FIR filter filters the second reference signal to generate a second sinusoidal signal and mixes the second sinusoidal signal and the second input signal to generate a fourth mixed signal;
wherein the controller is coupled with the third FIR filter and the fourth FIR filter and configured to:
determine a phase of the second input signal based on the third mixed signal and the fourth mixed signal, and
determine a phase difference between the input signal and the second input signal.

19. A finite impulse response (FIR) filter comprising:
a plurality of filter taps, each filter tap comprising:
a delay circuit comprising an input terminal to receive a square wave and an output terminal to output a delayed version of the square wave;
a switch comprising an input terminal, an output terminal, and a control terminal, the control terminal being electrically connected to the output terminal of the delay circuit to receive the delayed version of the square wave at the control terminal, and the input terminal of the switch being electrically connected to a common input signal line for the plurality of filter taps; and
a resistor electrically connected to one of the input terminal or the output terminal of the switch;
an operational amplifier, wherein an output terminal of each of the plurality of filter taps is electrically connected to an input terminal of the operational amplifier; and
a feedback path electrically connecting an output terminal of the operational amplifier to the input terminal of the operational amplifier.

20. The FIR filter of claim 19, wherein values for the resistors of the plurality of filter taps represent filter zeros that are selected to cancel harmonic frequencies of the square wave.

21. The FIR filter of claim 20, wherein the filter zeros are selected to cancel the third, fifth, seventh, ninth harmonics of the square wave.

22. The FIR filter of claim 19, wherein an output signal of the operation amplifier is a mixed signal comprising an input signal mixed with a sinusoidal signal at a fundamental frequency of the square wave.

23. The FIR filter of claim 22, wherein the common input signal is a direct current (DC) signal and the output signal of the operational amplifier is the sinusoidal signal at a fundamental frequency of the square wave.

24. The FIR filter of claim 19, wherein each delay circuit of the plurality of filter taps comprises a flip-flop.

* * * * *